(12) United States Patent
Ghyselen et al.

(10) Patent No.: US 7,256,075 B2
(45) Date of Patent: Aug. 14, 2007

(54) RECYCLING OF A WAFER COMPRISING A MULTI-LAYER STRUCTURE AFTER TAKING-OFF A THIN LAYER

(75) Inventors: Bruno Ghyselen, Seyssinet-Pariset (FR); Cécile Aulnette, Grenoble (FR); Bénédite Osternaud, St Laurent du Pont (FR); Takeshi Akatsu, Saint Nazaire les Eymes (FR); Yves Mathieu Le Vaillant, Crolles (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 0 days.

(21) Appl. No.: 11/075,273

(22) Filed: Mar. 7, 2005

(65) Prior Publication Data

US 2005/0170611 A1 Aug. 4, 2005

Related U.S. Application Data

(63) Continuation of application No. PCT/IB04/00311, filed on Jan. 7, 2004.

(60) Provisional application No. 60/472,435, filed on May 22, 2003.

(30) Foreign Application Priority Data

Jan. 7, 2003 (FR) ................................ 03 00099

(51) Int. Cl.
*H01L 21/00* (2006.01)

(52) U.S. Cl. ................... 438/149; 438/87; 438/455; 438/481; 257/E21.568

(58) Field of Classification Search ............. 438/457, 438/458, 506, 507, 445, 491, 670
See application file for complete search history.

(56) References Cited

U.S. PATENT DOCUMENTS 6,010,579 A 1/2000 Henley et al. ............. 148/33.2
6,284,628 B1 9/2001 Kuwahara et al. .......... 438/459

(Continued)

FOREIGN PATENT DOCUMENTS

FR 2 775 121 8/1999

(Continued)

OTHER PUBLICATIONS

B. Holländer et al., "Strain relaxation of pseudomorphic $Si_{1-x}Ge_x/Si(100)$ heterostructures after hydrogen of helium ion implantation for virtual substrate fabrication", Nuclear Instruments and Methods in Physics Research B 175-177 (2001) 357-367 (2001).

(Continued)

*Primary Examiner*—William David Coleman
*Assistant Examiner*—Su C. Kim
(74) *Attorney, Agent, or Firm*—Winston & Strawn LLP

(57) ABSTRACT

The invention relates to a method of transferring useful layers from a donor wafer which includes a multi-layer structure on the surface of the donor wafer that has a thickness sufficient to form multiple useful layers for subsequent detachment. The layers may be formed of materials having sufficiently different properties such that they may be selectively removed. The layers of material may also include sub-layers that can be selectively removed from each other.

30 Claims, 3 Drawing Sheets

U.S. PATENT DOCUMENTS

| | | | |
|---|---|---|---|
| 6,500,732 B1 | 12/2002 | Henley et al. | 438/459 |
| 6,537,370 B1 | 3/2003 | Hernandez et al. | 117/88 |
| 6,555,443 B1* | 4/2003 | Artmann et al. | 438/458 |
| 6,573,126 B2* | 6/2003 | Cheng et al. | 438/149 |
| 6,426,270 B1 | 7/2003 | Sakaguchi et al. | 438/406 |
| 6,596,610 B1 | 7/2003 | Kuwabara et al. | 438/458 |
| 6,750,130 B1* | 6/2004 | Fitzgerald | 438/607 |
| 6,828,214 B2* | 12/2004 | Notsu et al. | 438/455 |
| 6,841,001 B2* | 1/2005 | Saxler | 117/84 |
| 2004/0053477 A1 | 3/2004 | Ghyselen et al. | 438/465 |

FOREIGN PATENT DOCUMENTS

| | | |
|---|---|---|
| WO | WO99/41776 | 8/1999 |

OTHER PUBLICATIONS

R.T. Leonard et al., "*Photoassisted dry etching of GaN*", Applied Physics. Lett., vol. 68, No. 6, pp. 794-796, (1996).

S.J. Pearton et al, "*Low bias electron cyclotron resonance plasma etching of GaN, AlN and InN*", Applied Physics. Lett., vol. 64, No. 7, pp. 2294-2296, (1994).

L.J. Huang et al, "*SiGe-on-insulator prepared by wafer bonding and layer transfer for high-performance field-effect transistors*", Applied Physics. Lett., vol. 78, No. 9, pp. 1267-1269, (2001).

S. Nakamura, "*InGaN/GaN/AlGaN-Based Laser Diodes with an Estimate lifetime of longer than 10,000 hours*", Mrs Bulletin, vol. 23, No. 5, pp. 37-43 (1998).

Q.Y. Tong et al., Extracts of "*Semi-conductor on wafer bonding*", Science and Technology, Interscience Technology, a Wiley Interscience Publication, Johnson Wiley & Sons, Inc.

* cited by examiner

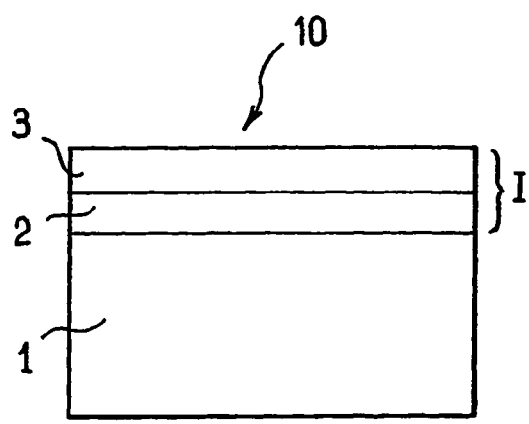
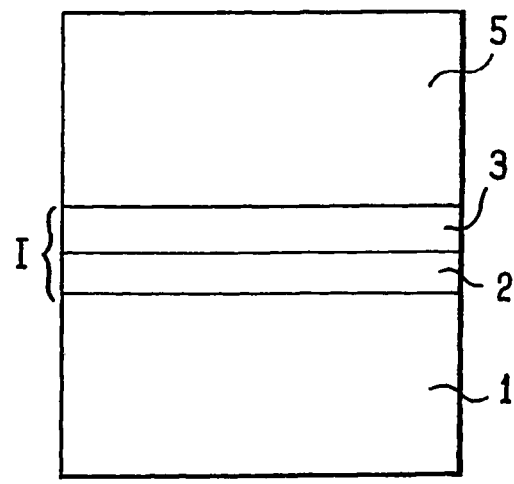
FIG_1a                    FIG_1b
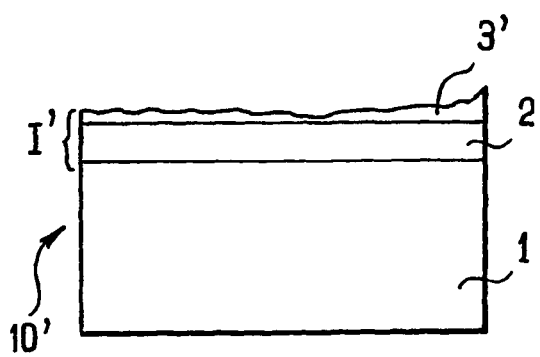
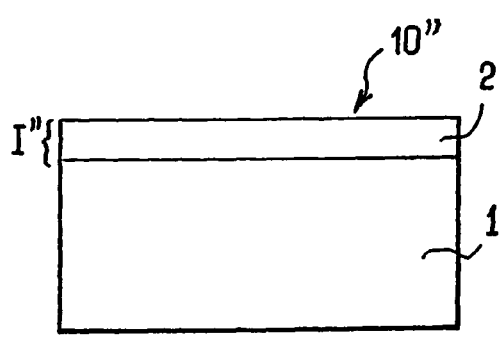
FIG_1c                    FIG_1d

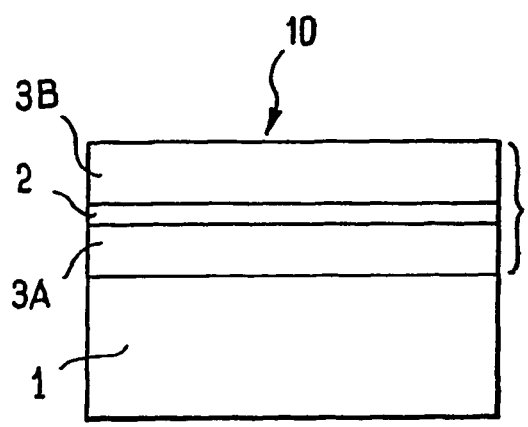
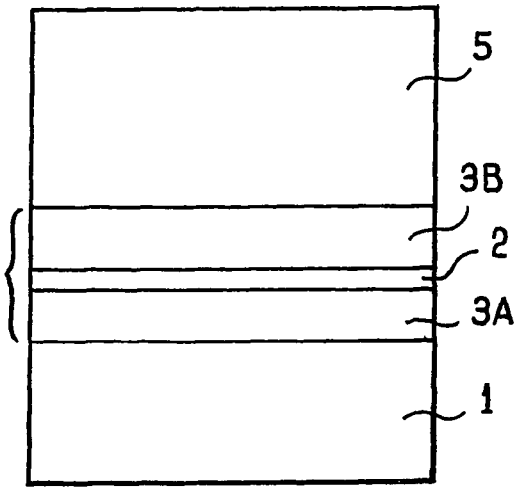
FIG_2a    FIG_2b
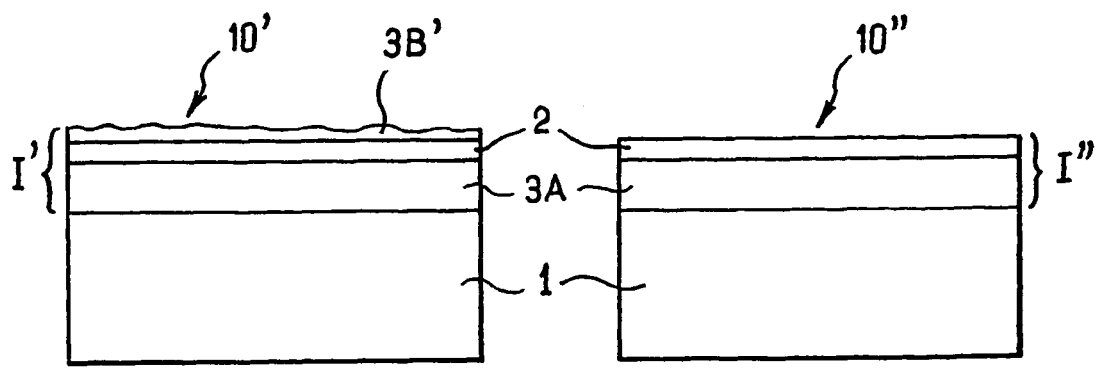
FIG_2c    FIG_2d

RECYCLING OF A WAFER COMPRISING A MULTI-LAYER STRUCTURE AFTER TAKING-OFF A THIN LAYER

CROSS-REFERENCE TO RELATED APPLICATIONS

This application is a continuation of International Application PCT/IB2004/000311 filed Jan. 7, 2004, and claims the benefit of provisional application 60/472,435 filed May 22, 2003, the entire content of each of which is expressly incorporated herein by reference thereto.

FIELD OF INVENTION

This invention relates to recycling of a donor wafer after taking off a layer of semiconductor material. This recycling includes removal of material involving a portion of the donor wafer on the surface where the useful layer was taken off.

BACKGROUND OF THE INVENTION

Before taking off the useful layer, the donor wafer comprises a substrate and a useful layer that is to be taken off or transferred from the substrate. The useful layer is typically obtained by epitaxially depositing the layer on the substrate.

After removal, the useful layer is integrated with a structure in which components will be formed, particularly in the fields of microelectronics, optics, or optoelectronics, for the most part.

The layer to be taken off must have a high level of quality determined according to one or more specific criteria. The quality of the layer to be taken off largely depends on the growth support, that is, on the quality of the substrate on which it is epitaxially deposited.

The formation of such a high quality substrate is often complex and requires particular attention, involving technical difficulty and a higher cost. The cost is further increased when considering the removal of a layer of a composite semiconductor material such as an alloy. In this situation, the epitaxy substrate also must exhibit a structure which is often difficult and costly to implement. Thus, substrates can be provided with a buffer layer to specifically avoid such difficulties of implementation.

The term "buffer layer" refers to a transition layer between a first crystalline structure, such as a support substrate, and a second crystalline structure. The second structure modifies the structural or stoichiometric properties of the material or a surface atomic recombination. Buffer layers permit the support structure to include a second crystalline structure having a lattice parameter that differs substantially from that of the support substrate.

A first technique of forming a buffer layer includes growing successive layers so as to form a structure having a composition varying gradually in thickness, the gradual variation of components of the buffer layer then being directly associated with a gradual variation of its lattice parameter. A layer, or superposed layers, formed on the buffer layer can be taken off from the donor wafer, and transferred to a receiving substrate so as to form a well-defined structure.

One of the main applications of a transfer of thin layers formed on a buffer layer concerns the formation of layers of elastically stressed silicon, and especially, in the case where the silicon is stressed in tension, because certain properties, such as electron mobility in the material, are distinctly improved. Other materials, such as SiGe, can also be the subject of a substantially analogous taking-off or transferring procedures.

A transfer of such layers onto a receiving substrate, specifically by a method termed SMART-CUT® that is known to those of skill in the art, then permits structures to be formed such as SeOI (Semiconductor On Insulator) structures.

For example, after taking-off an elastically relaxed layer of SiGe, the structure obtained, including the taken-off useful layer, can then serve as a growth support for silicon which will be placed under tension by the layer of relaxed SiGe. As an illustration, an example of such a method is described in the IBM document of L. J. Huang et al., ("SiGe-On-Insulator prepared by wafer bonding and layer transfer for high-performance field-effect transistors", Applied Physics Letters, Feb. 26, 2001, Vol. 78, No. 9) in which a process is given for forming a Si/SGOI structure.

Other applications of growth on a buffer layer are possible, particularly with Group III-V semiconductors. Transistors are commonly formed in technologies based on GaAs or based on InP. In terms of electronic performance, InP has an appreciable advantage over GaAs. For the main reasons of cost and feasibility, the chosen technique includes transferring to a receiving substrate a taken-off useful layer of InP obtained by growth on a buffer layer on a support substrate of GaAs.

Certain taking-off methods, such as an "etch-back" type method, include destruction of the remaining portion of the support substrate and of the buffer layer during taking-off. In certain other methods of taking-off, the support substrate is recycled, but the buffer layer is lost.

The technique of formation of a buffer layer is complex. Moreover, to minimize its density of crystallographic defects, the thickness of a buffer layer is generally considerable, typically between one and several micrometers. The production of such a buffer layer leads to an often long, difficult, and costly implementation.

A second technique of production of a buffer layer is disclosed in WO 00/15885, which has as its main object to elastically relax a layer of Ge that is stressed by a Ge buffer layer. This technique is based on specific epitaxy conditions, associating the parameters of temperature, time, and chemical composition. The main advantage of this technique is that it is simpler, shorter, and less costly to perform. The buffer layer finally obtained is not as thick as a buffer layer formed according to the first technique.

A third technique of formation of a buffer layer is disclosed by B. Höllander et al., "Strain relaxation of pseudomorphic $Si_{1-x}Ge_x/Si(100)$ heterostructures after hydrogen or helium ion implantation for virtual substrate fabrication" (in Nuclear and Instruments and Methods in Physics Research B 175-177 (2001) 357-367). It includes relaxing elastic stresses in the layer to be taken off by deep hydrogen or helium implantation. This third technique can give a result close to a buffer layer produced according to one of the two previous techniques with substantially less demands of implementation.

The method describes a relaxation of a SiGe layer stressed in compression, this layer being formed on a Si substrate. The technique used includes implantation of hydrogen or helium ions through the surface of the stressed layer in the Si substrate to a given depth, generating perturbations in the thickness of Si above the implanted zone (this thickness then forms a buffer layer) and causing, under heat treatment, a certain relaxation of the SiGe layer. This technique seems to be shorter, easier to practice, and less costly than the first technique of forming a buffer layer.

An advantage of using this technique would be to later integrate this relaxed or pseudo-relaxed layer into a structure for the fabrication of components, particularly for electronics or optoelectronics.

However, similar to the first technique for forming a buffer layer, a buffer layer made according to one of the last two techniques is removed using known techniques of recycling of the donor wafer after taking-off. Technical difficulties of implementation remain in carrying it out, so that improvement of the process is needed.

SUMMARY OF THE INVENTION

The invention relates to a method of transferring useful layers from a donor wafer which comprises forming a multi-layer structure on a surface of the donor wafer at a thickness sufficient to provide multiple useful layers for subsequent detachment; detaching one layer of the multi-layer structure for transfer as a first useful layer while leaving behind a remaining portion of the multi-layer structure; and removing material from the remaining portion of the formed multi-layer structure to provide a planarized surface for subsequent detachment of an additional useful layer. Preferably, the multi-layer structure has sufficient thickness to form at least three useful layers.

The useful layers are advantageously formed of materials having sufficiently different properties such that one layer may be selectively removed while at least one other layer remains intact. In one embodiment, the useful layers include pairs of sub-layers, with each sub-layer having sufficiently different properties from the other sub-layer in the layer such that one sub-layer may be selectively removed while at least one other sub-layer remains intact. A first layer of the multi-layer structure can be formed of a material having a lattice parameter different from the lattice parameter of the adjacent layers, and can be sufficiently thin such that the first layer may be elastically strained to have a lattice parameter similar to the lattice parameter of the adjacent layers, so that the first layer does not disturb the crystallographic structure of the adjacent layer or layers.

The useful layers can be removed in any one of a variety of ways. At least one useful layer is generally removed by chemical etching, such as electrochemical or photo-electrochemical etching. Additional useful layers can be removed mechanically by a selective mechanical-chemical planarization. If desired, all useful layers can be removed mechanically, such as by polishing, optionally including abrasion or chemical etching. Also, the useful layer can include a doping element to facilitate selective removal, or the layers can be made of materials having different porosities. A convenient selective removal process comprises deoxidation of an oxide layer.

A buffer structure can be formed on the donor wafer, wherein the buffer structure includes a support substrate and a buffer layer between the support substrate and the multi-layer structure. This buffer layer may comprise a semiconductor material of constant chemical composition having a lattice misfit with the support substrate, with the buffer layer having crystallographic defects in order to relax elastic stresses in the multi-layer structure. The buffer layer also may have a lattice parameter progressing substantially in thickness between a lattice parameter of the support substrate and another lattice parameter substantially different from that of the support substrate. Furthermore, the buffer structure may comprise an additional layer having one or more of a sufficient thickness to confine defects or a surface lattice parameter that is different from that of the support substrate. Generally, the buffer structure is formed of a binary, ternary, quaternary, or higher degree atomic alloy belonging to atomic alloy Group IV-V, Group III-V, or Group II-VI.

The donor wafer may comprise one of the following:

(A) a support substrate of Si and a buffer structure comprising a buffer layer of SiGe having a Ge concentration which increases in thickness and an additional layer of SiGe that is relaxed by the buffer layer;

(B) a support substrate of Si and a buffer structure comprising a buffer layer of SiGe having with a Ge concentration which increases in thickness between about 0% and about 100% and an additional layer of SiGe that is relaxed by the buffer layer, having a Si concentration of about 0%;

(C) a relatively thick layer of Si;

(D) a support substrate comprising GaAs in contact with the buffer structure, the buffer structure comprising a buffer layer having an atomic alloy of ternary or higher degree, belonging to Group III-V, and having a composition which chosen from among the possible combinations of (Al, Ga, In), (N, P, As), and at least two elements chosen from Group III or V, these two latter elements having a concentration evolving gradually in the thickness of the buffer layer;

(E) the buffer structure of (D) which further comprises, near its interface with the support substrate, a lattice parameter that is close to that of InP;

(F) a support substrate of sapphire, SiC, or Si, with a buffer structure comprising a buffer layer of $Al_xGa_{1-x}N$, with x varying from 0 to 1 starting from the interface with the support substrate, optionally including an additional layer of GaN; or (G) a support substrate of sapphire, SiC, or Si, a mask and a buffer layer of GaN, optionally with another layer of GaN between the mask and support substrate.

Preferably, the useful layers to be detached comprise Si or elastically stressed Si; Ge or elastically stressed Gei, SiGe and Ge; GaAs and Ge; an alloy belonging to Group III-V; GaAs, InP; InGaAs; AlN, InN, or GaN. Also, the multi-layer structure preferably comprises one of the following:

(A) two layers of almost elastically relaxed SiGe, and an intermediate layer between the SiGe layers comprising: Si elastically strained to have a lattice parameter similar to the lattice parameter of the adjacent SiGe layers; SiGe with a Ge concentration substantially different from the Ge concentrations in each of the two adjacent layers, and being elastically strained to have a lattice parameter similar to the lattice parameter of the adjacent layers; doped Si; or doped SiGe; wherein at least one of the layers has properties sufficiently different from the other layers to permit selective chemical etching of the adjacent layer;

(B) two layers of GaAs, and an intermediate layer of AlGaAs intermediate between the GaAs layers, wherein at least one of the layers has properties sufficiently different from the other layers to permit selective chemical etching of the adjacent layer;

(C) two layers of substantially elastically relaxed Si, and an intermediate layer between the Si layers comprising SiGe elastically strained to have a lattice parameter similar to the lattice parameter of the adjacent Si layers, doped Si, or doped SiGe; wherein at least one of the layers has properties sufficiently different from the other layers to permit selective chemical etching of the adjacent layer;

(D) two layers of InP, and an intermediate layer of InGaAsP between the two layers of InP, wherein at least one of the layers has properties sufficiently different from the other layers to permit selective chemical etching of the adjacent layer;

(E) an intermediate layer of InN between a AlN layer and a GaN layer; or (F) an intermediate layer of InN between two layers of GaN. It is also preferable for the donor wafer to include at least one layer that contains up to about 5% carbon.

The buffer layer may be formed by epitaxy of a superficial layer on the support substrate by stabilizing the support substrate to a predetermined first temperature; chemical vapor phase depositing of a base layer at the said predetermined first temperature to a predetermined thickness that is less than a desired final thickness; increasing the predetermined first temperature to a second predetermined temperature; and chemical vapor phase depositing additional material at the predetermined second temperature until the desired final thickness of the superficial layer is obtained. The buffer layer is that portion of the superficial layer that interfaces with the support substrate and extends over a thickness for which the rate of crystallographic defects is greater than a limit value, with the remaining portion of the superficial layer representing being at least a portion of the multi-layer structure.

In one embodiment, the multi-layer structure is completely formed by epitaxy on the superficial layer. In yet another embodiment, the buffer layer is formed by forming an elastically stressed layer on the donor wafer; forming a perturbation zone, capable of forming structural perturbations, at a given depth; and supplying energy to bring about an at least relative relaxation of at least part of the elastically stressed layer, with the relative relaxation taking place across a region delimited by the perturbation zone and by the stressed layer, this region also confining crystallographic defects and representing a buffer layer.

The buffer layer can also be formed by an Epitaxially Laterally Overgrown (ELOG) technique on a support substrate comprising at the surface a mask in relief according to specific patterns, the buffer layer being the thickness of the layer deposited by lateral epitaxy in which defects are confined relative to the layers deposited by lateral epitaxy thereon and representing the multi-layer structure. The specific patterns of the mask may be periodically spaced electrically insulating bands that are substantially mutually parallel and sufficiently fine to not perturb the ELOG. In this embodiment, the support substrate may comprise a solid substrate; an intermediate layer having a lattice parameter close to the nominal lattice parameter of the material deposited by ELOG; or the mask.

The buffer layer may be formed so as to have its lattice parameter progressing substantially in thickness between the lattice parameter of the support substrate and another lattice parameter substantially different from the lattice parameter of the support substrate. Additionally, the buffer structure may further comprise an additional layer, and the method further comprises, before the formation of the multi-layer structure, forming of an additional layer having a sufficient thickness to confine defects or a surface lattice parameter that is substantially different from that of the substrate. Generally, at least one of the layers of the multiplayer structure is formed by crystalline growth.

The invention also relates to a recyclable donor wafer comprising a substrate and a multi-layer structure on the substrate, with the multi-layer structure having sufficient thickness to form (a) at least two useful layers that can be detached, and (b) additional material that can be removed to planarize exposed surfaces of the useful layers prior to detachment from the donor wafer, with the useful layers being formed of at least one of SiGe, Si, an alloy belonging to Group III-V, and with the substrate having a composition chosen from among possible combinations of (Al, Ga, In) or (N, P, As). Preferred materials of the substrate and the multi-layer structure disposed thereon include those that are described herein.

BRIEF DESCRIPTION OF THE DRAWINGS

Other aspects, purposes and advantages of this invention will become clearer upon a review the following detailed description and examples which is made with reference to the accompanying drawing figure, in which:

FIGS. 1a-1d show the different steps in a process according to the invention that includes taking off a thin layer from a donor wafer followed by recycling of the donor wafer after taking off;

FIGS. 2a-2d show a first donor wafer before taking off according to the invention;

DETAILED DESCRIPTION OF THE INVENTION

Figure 3:
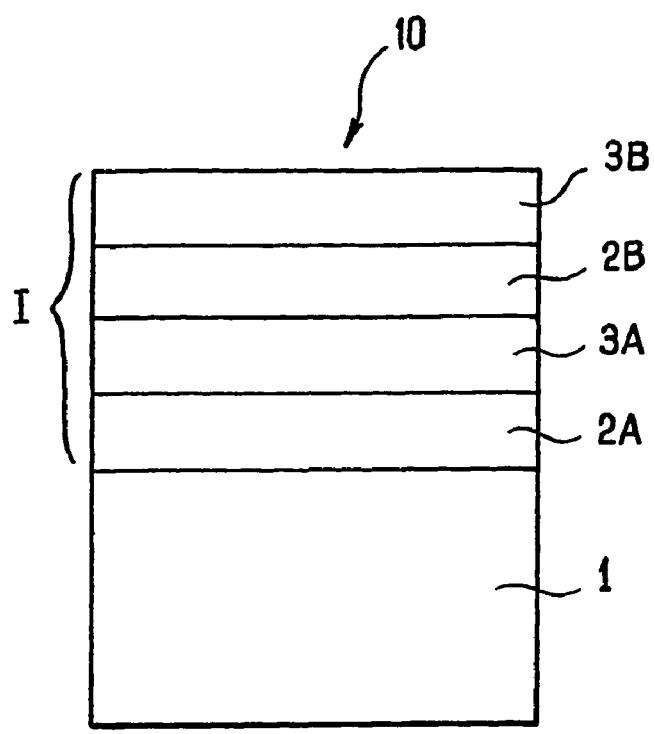
FIG. 3 shows the various steps in a process according to the invention including successively taking off a thin layer starting from a donor wafer, and recycling the donor wafer after taking off.

The present invention relates to a process of recycling a donor wafer (10) after taking off a useful layer formed of a material chosen from among semiconductor materials. The donor wafer (10) includes a substrate (1) and a multi-layer structure (I), the multi-layer structure (I) includes the taken-off useful layer. The process includes removal of material from a portion of the donor wafer (10) on the side where the taking-off has occurred, while preserving a portion of the multi-layer structure (I'). The multi-layer structure is formed to include at least one other useful layer which can be taken off after recycling, without a supplementary step of reforming the useful layer.

The invention also relates to a process of making a donor wafer that will donate a useful layer by taking-off, and that can be recycled after taking off using the recycling process. The process includes forming a multi-layer structure on a substrate for subsequent transfer of the useful layers of the structure.

The invention further relates a method of taking-off a useful layer on a donor wafer to be transferred onto a receiving substrate. The method includes the generally steps of:

(a) bonding the donor wafer with the receiving substrate on the side of the useful layer to be taken off;

(b) detaching the useful layer included in the multi-layer structure of the donor wafer; and (c) recycling the donor wafer in accordance with the recycling process.

The method may be performed cyclically by taking off a useful layer from a donor wafer, re-forming a useful layer, and taking off an additional useful layer. The useful layers are used in a donor wafer that includes a receiving substrate and the useful layer. The useful layer may be formed of at least one of the following materials: SiGe, Si, an alloy belonging to the atomic alloy Groups III-V, and having a composition chosen from among possible combinations of (Al, Ga, In)-(N, P, As).

The invention also relates to a donor wafer that donates a useful layer by taking-off, and recycled or capable of being recycled by a recycling process. The donor wafer includes a substrate, a multi-layer structure that supplied the useful layer, and after taking off, having a sufficient thickness to form at least one other useful layer that can be taken off.

The invention relates to recycling a donor wafer. The wafer includes a multi-layer structure, after taking off at least one useful layer (in other words the part of the donor wafer that was taken off) in order to integrate it into a semiconductor structure. The recycling may be performed such that the remaining part of the multi-layer structure can once again supply a useful layer in a subsequent taking off after recycling without implementing a step to reform the useful layer, such as crystalline growth by epitaxy. Therefore, recycling must include adapted treatment to not deteriorate part of the multi-layer structure in which the useful layer is included, so that this useful layer can still be taken off after recycling.

In one embodiment, several useful layers that can be taken off may be included in the recycled multi-layer structure, so as to have a sequence of several successive taking off operations between which a recycling process may be applied.

With reference to FIGS. 1a, 1b, 2, 2a, 2b, 3 and 4, the donor wafer 10 includes a substrate 1 and a multi-layer structure I. The substrate 1 may be formed of a single crystalline material with the first lattice parameter, or it may be a "pseudo-substrate" that includes a support substrate and a buffer structure interfaced with the multi-layer structure I. A "buffer structure" refers to any structure behaving like a buffer layer.

Preferably, the structure at the surface has a fairly relaxed crystallographic structure without a significant number of structural defects. The buffer layer performs at least one of the following functions: reduction of the density of defects in the upper layer or adaptation of a lattice parameter between two crystallographic structures with different lattice parameters.

To perform the second function, the area around the periphery of one of the faces of the buffer layer has a first lattice parameter almost identical to the lattice parameter of the support substrate, and the area around the periphery of its other face has a second lattice parameter almost identical to the lattice parameter of the layer of the multi-layer structure I directly adjacent to the buffer structure.

In one embodiment, the buffer structure includes a single buffer layer. The buffer layer located on the support substrate has a lattice parameter on its surface significantly different from the lattice parameter of the support substrate, so that it has a layer in the same donor wafer 10 with a lattice parameter different from the lattice parameter of the support substrate. In some applications, the buffer layer may prevent the adjacent layer from containing a high density of defects or from being significantly strained. In some applications, the buffer layer may also result in a good surface condition of the adjacent layer.

According to a first technique for making the buffer structure, a buffer layer is formed so as to have a lattice parameter that is globally and progressively modified over a significant thickness, to form the transition between the two lattice parameters. This type of layer is usually called a metamorphic layer. This modification to the lattice parameter may be made continuously within the thickness of the buffer layer.

The modification may be done in "stages," each stage being a thin layer with an almost constant lattice parameter different from the lattice parameter for the adjacent stage, so as to modify the lattice parameter discretely stage by stage. The modification may also have a more complex form, such as a variation of a variable content composition, an inversion of the sign of the variation of the content, or discontinuous steps in the composition.

The variation of the lattice parameter in the buffer layer is advantageously found by increasing the concentration in the buffer layer of at least one atomic element that is not included in the support substrate, progressively starting from the support substrate. For example, a buffer layer made on a support substrate of a unitary material, or of a binary, ternary, quaternary, or higher degree material.

The buffer layer is preferably made by growth on the support substrate, for example by epitaxy, using known techniques such as CVD (Chemical Vapor Deposition) and MBE (Molecular Beam Epitaxy) techniques. In general, the buffer layer may be made by any other known method in order to obtain a buffer layer composed of an alloy between different atomic elements. A light finishing step of the surface of the support substrate subjacent to the buffer layer, such as by CMP polishing, may be performed before the buffer layer is produced.

In another embodiment, the buffer layer made according to the first technique is included in a buffer structure that includes a buffer layer (almost identical to the first buffer layer in the first configuration) and an additional layer. The additional layer may be between the support substrate and the buffer layer, or on the buffer layer. This additional layer may form a second buffer layer, such as a buffer layer to confine defects, and thus improve the crystalline quality of the multi-layer structure I made on the buffer structure. This additional layer is made of a semi-conducting material, which may preferably have a constant material composition. The composition and thickness chosen for such an additional layer are particularly important for achieving this property. Structural defects in an epitaxial layer usually reduce gradually within the thickness of this layer.

In another embodiment, the additional layer is located on the buffer layer and has a constant composition of relaxed material to fix the second lattice parameter.

The additional layer may be located on the buffer layer and have a lattice parameter significantly different from the lattice parameter of the support substrate. The additional layer may be formed of a material relaxed by the buffer layer. The additional layer is advantageously made by growth on the buffer layer, such as by epitaxy, CVD, or MBE.

In a first embodiment, the growth of the additional layer is made in situ, directly continuous with the formation of the subjacent buffer layer, the subjacent buffer layer in this case also advantageously being formed by layer growth. In a second embodiment, the additional layer is grown after a surface finishing of the subjacent buffer layer, for example by CMP polishing, heat treatment, or any other smoothing technique.

A second technique for making the buffer structure is based on a technique for depositing a surface layer on a support substrate, this surface layer having a nominal lattice parameter significantly different from the lattice parameter of the adjacent material on the surface of the support substrate. The surface layer deposit is formed so that the deposited layer is nearly free from plastic defects such as dislocations. A first part of the surface layer is in contact with the support substrate, that confines plastic defects such as dislocations and a second part of the surface layer is relaxed or pseudo-relaxed by the first part, and has few or no plastic defects.

The first part of the deposited surface layer acts as a buffer layer by confining plastic defects so as to preserve the second part of the surface layer and adapting the lattice parameter of the surface layer to match the lattice parameter of the substrate.

"Confinement" means that most plastic defects are located in the first part. The second part of the surface layer is not absolutely free of defects, but the concentration of defects is compatible with microelectronics applications.

The deposition technique used to make such a buffer layer advantageously includes variations of temperatures and chemical compositions of the deposit with time. Thus, a buffer layer can be made with a chemical composition that is almost constant throughout its thickness, unlike a buffer layer made according to the first technique. One or more layers may be inserted between the buffer layer and the second part of the surface layer. The thickness of the buffer layer may be less than the minimum thickness of buffer layers made according to the first technique. WO 00/15885 discloses an example of such a buffer layer according to this technique, by depositing SiGe or Ge on a monocrystalline Si support substrate.

For example, this type of deposition process may be used to deposit of monocrystalline Ge on a monocrystalline Si support substrate, according to the following steps:

(A) temperature stabilization of the monocrystalline silicon support substrate at a first predetermined stabilized temperature of about 400° C. to 500° C., preferably about 430° C. to 460° C.;

(B) chemical vapor deposition (CVD) of Ge at the first determined temperature until a base layer of Ge is obtained on the support substrate with a predetermined thickness less than a required final thickness;

(C) increase in the temperature of the chemical vapor deposition of Ge from the first predetermined temperature up to a second predetermined temperature of about 750° C. to 850° C., preferably about 800° C. to 850° C.; and (D) continuation of the chemical vapor deposition of Ge at the second predetermined temperature until the final required thickness is obtained for the surface layer of monocrystalline Ge.

The buffer layer is the part of the deposited layer that interfaces with the support substrate and extends over a thickness in which the crystallographic defects ratio is greater than a limiting value. In particular, the thickness of this buffer layer may be on the order of about 0.5 to 1 micron, which is less than the thickness of a buffer layer made according to the first technique. The other part of the layer is at least part of the multi-layer structure I. This type of deposition process may also be performed by other means, such as that disclosed in WO 00/15885. The result is production of the substrate 1 of the donor wafer 10, the substrate 1 including the support substrate and the buffer layer.

A third technique for making a buffer structure that is used on the wafer and that includes the substrate 1 and a layer deposited on the substrate 1. The material chosen to form this buffer layer generally has a nominal lattice parameter significantly different from the lattice parameter of the surface of substrate 1, so that it has to be elastically strained in compression or tension by substrate 1.

The general structure of the strained layer is made of a strained material, but it may also contain one or several thicknesses of relaxed or pseudo-relaxed material for which the accumulated thickness is significantly less than the thickness of the strained layer, so that the strained layer remains in a globally strained state. In all cases, the strained layer is preferably formed on substrate 1 by crystalline growth such as by epitaxy, and using known techniques, such as the CVD or MBE.

In order to obtain such a strained layer without too many crystallographic defects, such as isolated defects, or extensive defects, such as dislocations, crystalline materials are preferably chosen to form the substrate 1 and the strained layer (close to its interface with substrate 1) so that the difference between the first and second nominal lattice parameters is sufficiently small. For example, the difference in the lattice parameter is typically about 0.5% to about 1.5%, but it could be higher.

For example, in Group IV-IV materials, the nominal lattice parameter of Ge is about 2.4% greater than the lattice parameter of Si, and therefore SiGe with 30% of Ge has a nominal lattice parameter about 11.5% greater than the lattice parameter of Si.

Preferably, the thickness of the strained layer is almost constant, so that it has nearly constant intrinsic properties to facilitate future bonding with the receiving substrate (as shown in FIG. 1b or 2b). To prevent relaxation of the strained layer or the appearance of plastic type internal stresses, the thickness of the strained layer must also remain less than a critical elastic strain thickness. This critical elastic strain thickness depends mainly on the material chosen to form the strained layer and the difference in the lattice parameter with the substrate 1. Those skilled in the art will use information known in the art to determine the value of the critical elastic strain thickness of the material to be used for the strained layer formed on the material used for the substrate 1. Therefore, once the strained layer is formed, it has a lattice parameter approximately the same as the lattice parameter of its growth substrate 1, and is then subjected to internal elastic compression or tension strains.

Once the structure is formed, the third technique for making a buffer structure includes a step for the formation of a perturbation zone or zone of weakness at a given depth in the substrate 1. A perturbation zone is defined as a zone in which internal stresses exist that can form structural disturbances in surrounding parts. This zone is preferably formed over most of the surface of the substrate 1 parallel to the surface of the substrate 1.

One method for forming such a zone of weakness includes implanting atomic species in the substrate 1 at a given determined depth, with a determined implantation energy and determined proportioning of atomic species. In one embodiment, the implanted atomic species include one or more of hydrogen and helium.

This type of perturbation zone formed by implantation then includes internal strains, or even crystallographic defects, exerted by the atomic species implanted on the crystalline network adjacent to the disturbance zone. These internal strains can then create crystallographic disturbances in the overlying zone.

According to this method, the buffer layer is made while a second step is being carried out by an energy input to help with the appearance of disturbances in the region overlying the perturbation zone, increase the amplitude of these disturbances in this overlying region, and cause an elastic relaxation at least in the strained layer following the appearance of disturbances. The main purpose of such energy input is to cause at least relative relaxation of the elastic strains in the strained layer in order to form a relaxed strained layer.

The intermediate region within substrate 1 between the disturbance zone and the strained layer confines dislocation type defects and adapts the lattice parameter of the substrate 1 to the nominal lattice parameter of the strained layer. Therefore, in this case this intermediate region may be considered a buffer layer.

A heat treatment is advantageously used to generate the sufficient energy input to cause these structural modifications. This heat treatment is advantageously carried out at temperatures significantly lower than a critical temperature above which a significant number of implanted atomic species would be degassed.

Thus, local crystallographic disturbances are created from these internal strains in the perturbation zone. These disturbances appear mainly in the buffer layer due to minimization of elastic energy in the strained layer, and they increase in amplitude under the influence of the heat treatment.

When these disturbances have become sufficiently large, they act on the strained layer by relaxing the elastic stresses in the strained layer at least in relative terms. These relaxed strains are mainly being due to the mismatch in the lattice parameters for the nominal mesh in the material in the strained layer and the material in substrate 1. Relaxation of the strained layer can also be accompanied by the appearance of inelastic type crystalline defects in the thickness of the strained layer, such as through dislocations.

Suitable treatments, such as a heat treatment, may be applied to reduce the number of these defects. For example, an adapted treatment may be used to increase the density of dislocations to bring it between two limiting values, the two limiting values defining an interval of dislocation densities in which at least some of the dislocations cancel each other out.

In all cases, the end result is a relaxed or pseudo-relaxed layer for which the nominal lattice parameter is significantly different from the nominal lattice parameter of the growth substrate 1 and which has a low content of dislocations disadvantageous for the formation of microelectronic components in the relaxed strained layer. This relaxed or pseudo-relaxed layer may form at least part of the multi-layer structure I. For more information, refer to B. Höllander et al., "Strain relaxation of pseudomorphic $Si_{1-x}Ge_x/Si(100)$ heterostructures after hydrogen or helium ion implantation for virtual substrate fabrication" (Nuclear and Instruments and Methods in Physics Research B 175-177 (2001) 357-367). The buffer layer made using this method is included in substrate 1 as defined before use of this third method for making the buffer layer.

A fourth technique for making the buffer structure is based on a support substrate for the buffer structure to be made, for which the surface is in relief and deposition of the component elements of the buffer structure on the support substrate. Since the surface of the support substrate is not planar, the deposition of the components of the buffer structure is made anisotropically with growth selectivity effects and local coalescence that result in the constructed buffer structure with determined properties.

This fourth method of making the buffer structure uses determined techniques with parameters set such that the properties obtained in the buffer layer correspond to crystallographic defect confinement properties, so that the multi-layer structure I that will be made on the buffer structure has an intrinsic quality structure.

The choice of the topography of the support substrate is one of the essential factors for obtaining such a result. Preferably, a topography with patterns will be chosen that is periodically repeated over the entire surface of the support substrate, in order to have a homogeneous influence over the entire surface of the wafer. For example, there would be a support substrate with bands at a fixed distance from each other in order to concentrate dislocations of epitaxied layers close to the bands, and particularly the corners of the bands. The thickness of the layer in which most of the dislocations are confined then forms the buffer layer. The bands are preferably formed of an insulating material formed on a substrate and which forms a mask to materials that will be deposited subsequently.

Furthermore, an intermediate layer of crystalline materials may be inserted between a solid substrate and the structure in relief, acting as a substrate for growth of the buffer structure. The insulating structure in relief is sufficiently thin so that it does not disturb resumed growth of the buffer structure on the growth substrate subjacent to it. This technique is also called ELOG and is applied mainly to deposits of nitride films by MOCVD (Metal Organic-Chemical-Vapor-Deposition) epitaxy. For example, the article by Shuji Nakamura entitled "InGaN/GaN/AlGaN-Based Laser Diodes with an Estimated Lifetime of Longer than 10 000 hours" in the "Materials Research Community" Bulletin, May 1998, volume 23, No. 5, can be used as a basis, which in particular describes growth of GaN on a structure of $SiO_2$ bands. Example 9 below will describe a GaN structure made using this fourth technique for making the buffer structure by ELOG.

Regardless of the structural configuration in substrate 1 (which may or may not include a buffer structure), the substrate 1 is formed from a crystalline material at the interface with the multi-layer structure I, with few or no crystallographic defects. At least some of the different layers forming the multi-layer structure I are preferably made by growth on the substrate 1, for example by epitaxy, CVD, or MBE.

In one embodiment, at least some of these layers are grown in situ, directly in continuation with the formation of the layers subjacent to each layer, the subjacent layers in this case also advantageously being formed by layer growth. In a second embodiment, at least some of these layers are grown after applying light surface finishes to the layers subjacent to each layer, such as by CMP polishing, heat treatment, or other smoothing technique. Finally, a multi-layer structure I is obtained that includes layers of crystalline materials.

The multi-layer structure I before recycling has a thickness of at least two useful layers. However, the multi-layer structure I is preferably thicker than two useful layers to compensate for material thicknesses removed during treatment(s) applied during recycling to correct defects often created when the useful layer is taken off. Roughness, thickness variations, structural defects, or other types of defects are frequently found on the surface of a donor wafer 10 after taking off, like that shown in the post-taking off layer 3' in FIG. 1c or FIG. 2c. For example, projections or rough parts may appear on the surface to be taken off of the remaining donor wafer 10, after taking off.

These surface parts in relief that appeared on the surface of the multi-layer structure I depend mainly on the manner of taking off and the technique used during taking off. For example, one manner of taking off frequently used in industry includes taking off the useful layer over only part of the donor wafer 10 (which is typically near the center) and leaving projections over the surface of the donor wafer 10, rather than over the entire surface of the donor wafer 10. These projections are typically single-piece and located around the periphery of the surface of the donor wafer 10, all projections then being called a "taking off ring" in the business. Known taking off techniques, like those described in more detail below, or the SMART-CUT® technique mentioned above, will sometimes cause surface roughness.

Therefore the thickness of the multi-layer structure I before taking off must be at least two useful layers to be taken off and a thickness greater than or equal to a thickness margin corresponding to the minimum amount of material to be removed during the recycling operation(s). This thickness margin is typically of the order of one micron in the case of recycling after a SMART-CUT® type of taking off (which is generally known and described below). However, this thickness margin can be reduced by using high performance recycling techniques such as selective chemical etching.

One main type of processing applied during recycling is a process for removing material such that only part of the multi-layer structure I remains, including at least one other useful layer that can be taken off after recycling. This material removal is applied on the donor wafer 10, at the free surface of the multi-layer structure I that remains after taking off.

In one particular recycling process, a surface treatment is applied to remove part of the multi-layer structure I on which the useful layer was taken off. A surface thickness containing surface defects that appeared during taking off is removed, such as dislocation type crystallographic disturbances or isolated defects.

Several surface treatments such as the following can thus be applied individually or in combination:

(A) dry or wet chemical etching, preferably applied in a bath, by plasma, or by atomization; etching may be chemical, electrochemical, or photo-electrochemical alone, or any other equivalent etching, such as etching applied during mechanical-chemical polishing;

(B) annealing, for example under hydrogen;

(C) chemical etching, for example under HCl accompanied by annealing; or (D) surface oxidation, carried out using oxidation techniques known to one skilled in the art, on the surface of the multi-layer structure I, followed by removal of the oxidized layer by deoxidation, preferably using a chemical process (such as attack by a hydrofluoric acid bath) preferably preceded by an annealing step. This type of sacrificial oxidation process is described below.

A surface treatment may also significantly improve the surface condition of the multi-layer structure I remaining after taking off, and also the uniformity of its thickness, particularly in the case of the last four surface treatments. This is particularly useful if bonding is applied when the useful layer is taken off. Regardless of the surface treatment(s) selected, the surface quality of the multi-layer structure I may be improved compared with the surface condition before this treatment was applied.

In a first case, the improvement in the structural and geometric quality of the multi-layer structure I is sufficiently good so that a useful layer can be taken off without any additional material removal treatments. In this case, and in a first configuration of the multi-layer structure I before taking off, the multi-layer structure is formed of several layers of the same material with almost the same properties. In this case and in a second configuration of the multi-layer structure I before taking off, this multi-layer structure includes several layers, such as shown in FIGS. 1a, 2a, 3 or 4, with material properties significantly different from each other at each of their interfaces. Regardless of the configuration of the multi-layer structure I, after taking off, material is removed from the surface over a given thickness so that finally there will be one or more layers remaining including one or more useful layers that can be taken off in a subsequent taking off operation.

In a second case, the improvement in the structural and geometric quality of the multi-layer structure I obtained after use of the surface treatment is not sufficient for a useful layer to be taken off without subsequent material removal treatments. The additional treatments preferably include selective removal of one layer with regard to the adjacent layer, the selectivity between the two layers being due essentially to significant differences in the properties of the two materials forming these two layers.

Selective material removal may also follow another material removal different from that obtained after a surface treatment. For example, a more massive removal of material on part of the multi-layer structure I may have been applied, such as mechanical removal by grinding, polishing, abrasion, or bombardment. However, a treatment for selective material removal may also be applied without necessarily applying prior treatments such as surface treatments or more massive material removals.

In order to apply such a selective material removal, before taking off, the multi-layer structure I includes a layer that stops removal of the material in the overlying layer. The two materials that make up the two layers close to their interface are chosen such that there is a means of selectively removing material, with a capacity for attacking the layer to be removed significantly greater than the capacity for attacking the stop layer. Taking off then applies to the part of the multi-layer structure I above the stop layer, on the side of the stop layer opposite the substrate 1.

Several techniques for the selective removal of material may be used for the protection layer 3. A first technique for the selective removal of material includes exerting friction forces on the layer to be selectively removed, to pull off at least part of the material to be removed. For example, these friction forces may be exerted by a polishing plate, possibly combined with an abrasive or chemical action.

The material that forms the stop layer is chosen from semiconductors so that there is a mechanical means of attacking the material with a significantly lower capacity to mechanically attack the material forming the stop layer than the capacity to attack the material in the overlying layer to be removed, and thus being suitable for the use of at least one selective mechanical attack. The material in the stop layer then has significantly greater resistance to the mechanical attack used than the layer overlying it.

Consequently, it would be possible to suitably harden the protection layer 3 to make it more resistant than the overlying layer to the mechanical attack selected to remove the overlying layer. For example, a semiconductor material such as Si, carbonated with a concentration of C typically between about 5% and 50%, is harder than the same non-carbonated semiconductor.

A second technique for selective removal of material includes chemically and selectively etching the material to be removed. A wet etching process may be used with etching solutions adapted to the materials to be removed. A dry etching process may also be used to remove material, such as etching by plasma or atomization. Etching may also be chemical, electrochemical, or photo-electrochemical.

The material from which the stop layer is formed is chosen from among semiconductors so that there is a fluid (a gas or a solution depending on whether the etching is dry or wet) for etching with a significantly lower capacity to etch the material forming the stop layer than the material in the overlying layer to be removed, and thus being capable of implementing selective etching.

However, the term "stop layer" has a primary function of "stopping" etching, even if there is no absolute stopping of etching. This is particularly the case for etching by atomization, which is more accurately referred to as "atomization rate" or "attack rate".

In general, the selectivity of etching a layer A with respect to a layer B is quantified by a selectivity factor related to the ratio $$\frac{\text{Etching rate for layer } A}{\text{Etching rate for layer } B}$$

The stop layer thus acts as a barrier to chemical attack, by protecting itself and the layer subjacent to it (which includes substrate 1). The selectivity of chemical etching between the material in the stop layer and the material in the layer to be removed by selective etching may be obtained by the two materials being different; the two materials containing almost identical atomic elements, except for at least one atomic element; the two materials being almost identical, but the atomic concentration of at least one atomic element in a material is significantly different from the atomic concentration of the same atomic element in the other material; or the two materials having different porosity densities.

For example, SiGe behaves like a stop layer with regard to etching of Si with a solution containing compounds such as KOH (selectivity about 1:100), $NH_4OH$ (selectivity about 1:100) or TMAH (tetramethyl ammonium hydroxide). SiGe with a concentration of germanium greater than or equal to 25% behaves like a stop layer with regard to etching of SiGe with a germanium concentration less than or equal to 20%, with a solution containing compounds such as TMAH. Si suitably doped with a selected doping element and a selected concentration, such as boron at more than $2 \times 10^{19}$ $cm^{-3}$, behaves like a stop layer for etching undoped Si with a solution containing compounds such as EDP (ethylene diamine and pyrocathechol), KOH, or $N_2H_2$ (hydrazine). Porous Si is etched using an etching that is selective with regard to non-porous crystalline Si, using a solution containing compounds such as KOH or $HF+H_2O_2$.

This chemical removal of material may also be accompanied by the use of mechanical or other means for attacking the material. In particular, CMP polishing may be used with a selective chemical etching solution. A selective chemical etching may also be preceded or followed by removal of material made by mechanical means of attacking the material such as polishing, grinding, abrasion or any other means.

A third technique for selective removal of material includes applying sacrificial oxidation. In this respect, the multi-layer structure I includes an oxidizable layer with a greater oxidation capacity than the subjacent layer, and that will be the layer to be removed selectively with respect to the subjacent layer to be kept that acts as the stop layer. The oxidizable layer is included within the multi-layer structure I before taking off (and therefore before recycling), and the taking off then applies to the part of the multi-layer structure I located above the oxidizable layer on the side of the stop layer opposite the substrate 1.

The oxidizable layer is oxidized after taking off at the surface of the multi-layer structure I at the time of recycling, and then corresponds to a treatment technique for the removal of surface material described above. Regardless of the selected configuration, the sacrificial oxidation process includes a step for forming of an oxide layer, possibly an annealing step, and a deoxidation step. Oxidation may apply to the oxidation of one or several layers. Oxidation may also be done near the surface of the stop layer. Oxidation is done using any of the known oxidation techniques, such as thermal oxidation.

In the case where thermal oxidation is used, the main parameters are the oxidation temperature and duration. Other important parameters are the oxidizing nature of the atmosphere, the oxygen content, and treatment pressure conditions. These parameters may be well controlled to facilitate reproducibility.

The annealing step cures defects that might occur during the oxidation step. The deoxidation step includes selectively removing the oxide layer with respect to the stop layer, for example by a chemical process using a hydrofluoric acid bath, and forms the selective material removal. For example, oxidized silicon dipped in a 10% or 20% hydrofluoric acid bath for a few minutes can typically remove one hundred to several hundred nanometers of thickness of this oxide.

Regardless of the method(s) used for selective removal of material in the process according to the invention, in all cases they can maintain a quality of the layers of the multi-layer structure I remaining after recycling almost identical to the quality that they had before recycling, and similar to the original quality during their formation (before the first taking off) such as a layer with a quality similar to the quality of the epitaxied layer. The removable layer(s) remaining present in the multi-layer structure I after recycling according to the invention thus have very good quality, particularly a structural quality. Examples of selective removals of material applied during recycling, taking off processes that can be used, and donor wafers before recycling are detailed below.

With reference to FIG. 1a, the multi-layer structure I before taking off is includes a first layer 2 and a second layer 3 on the first layer 2, the first layer 2 forming a stop layer for selective removal of the second layer 3. Layer 2 and layer 3 are each at least as thick as the thickness of the useful layer.

A method for taking off a thin layer is shown in FIGS. 1b and 1c. A first preferred take off step according to the invention includes creating a weakening area in the second layer 3, in order to perform a detachment and thus take off the required layer(s).

Several techniques may be used to create a weakening area of this type. A first technique, called the SMART-CUT® known to those skilled in the art (and is described in a number of books dealing with techniques for reducing wafers) includes a first step in which atomic species (such as hydrogen ions) are implanted with a determined energy to thus create a weakening area. A second technique includes forming a weakened interface by creation of at least one porous layer, such as described EP-A-0 849 788. The weakened area is created between the first layer 2 and the second layer 3 or in the second layer 3.

With reference to FIG. 1b, a second step of taking off a thin layer includes adding on a receiving substrate 5 to the surface of the donor wafer 10. The receiving substrate 5 forms a sufficiently rigid mechanical support to support the second layer 3, part of which will be taken off the donor wafer 10 to protect it from any mechanical stresses from the outside. This receiving substrate 5 may be made of silicon or quartz or any other type of material. The receiving substrate 5 is added by bringing it into intimate contact with the multi-layer structure I and bonding it, in which there is preferably a molecular bonding between the substrate 5 and structure 1. This bonding technique, and variations of it, are described in "Semiconductor Wafer Bonding" (Science and technology, Interscience Technology) by Q. Y. Tong, U. Gösele and Wiley.

If necessary, bonding is accompanied by an appropriate treatment of the corresponding surfaces to be bonded by adding thermal energy or by adding an additional binder. Thus, a heat treatment used during or immediately after bonding makes the bond rigid. Bonding may also be controlled by a bonding layer such as silica, inserted between the multi-layer structure I and the receiving substrate 5, with particularly strong molecular bonding capacities.

Advantageously, the material forming the bonding face of the receiving substrate 5 or the material of the bonding layer formed if any, is electrically insulating to make an SeOI structure from the taken off layers. The semiconductor layer of the SeOI structure in this case is the taken off part of the second transferred layer 3. Once the receiving substrate 5 is bonded, part of the donor wafer 10 is removed at the weakened area formed previously, by detaching it.

In the case of the SMART-CUT® technique, a second step is performed wherein the area implanted (forming the weakening area) is subjected to a thermal and/or mechanical treatment, or a treatment with any other type of energy input, to detach it at the weakening area. In the case of the second technique, the weakened area is mechanically treated, or another type of energy is input, in order to detach it at the weakened layer. Detachment at the weakening area according to one of these two techniques removes the largest part of the wafer 10, to obtain a structure from whatever is left of the second layer 3 that was taken off (which in this case represents the useful layer), the bonding layer, if any, and the receiving substrate 5.

A finishing step on the surface of the structure formed at the taken off layer is preferably applied to remove any surface roughness, non-homogeneities in the thickness, or undesirable layers, by using, for example, a chemical mechanical polishing CMP, etching, or at least one heat treatment. In one embodiment, a stop layer with a selective removal of material may be included in the useful layer in order to improve the finish of the useful layer by selective removal of material stopped at this stop layer.

A post-taking off layer 3' forms the part of the second layer 3 that remained after taking off and located above the first layer 2 and the complete wafer forming a donor wafer 10' to be sent to recycling so that it can be reused later during taking off a subsequent layer. The result of recycling such a donor wafer 10' is shown in FIG. 1d. It uses selective removal of material in the post-taking off layer 3' with respect to the first layer 2, possibly followed by or preceded by a surface finishing step. The donor wafer 10" is then capable of providing a useful layer taken off in the first layer 2 during a subsequent taking off without any additional step.

In another embodiment, the donor wafer 10 includes several pairs, each formed of a first layer 2 and second layer 3, the second layer of each pair can be removed selectively with respect to the first layer in the same pair by a means of selectively removing the material. These layers may also be referred to as sub-layers. Preferably, one of the layers 2 of a pair may be selectively removed with respect to the layer subjacent to it, which is included within the multi-layer structure I. This embodiment has the advantage that the layer 3 may be removed selectively with respect to the subjacent layer 2 or the layer 2 may be removed selectively with respect to the layer subjacent to it. Still, in one special case, the layer subjacent to layer 2 is a layer 3 that belongs to another pair of layers.

One example of a particular configuration of a multi-layer structure I that includes several such pairs of layers is given with reference to FIG. 3, in which the multi-layer structure I is composed of a first pair consisting of a first layer 2A and a second layer 3A and a second pair consisting of a first layer 2B and a second layer 3B, each layer having the same thickness or a greater thickness than the useful layer. In this embodiment of a donor wafer 10, one or more layers may be removed in one or more steps, according to one process of the invention. One or more intermediate recycling steps may be applied by selective removal of material on the part of the layer remaining after taking off and the subjacent layer that includes at least one useful layer that can be taken off. Thus, with this particular configuration, it is possible to take off useful layers with one or multiple layers of materials.

With reference to FIG. 2a, the multi-layer structure I includes a first layer 2 inserted between a second layer 3B overlying it and a third layer 3A adjacent to the substrate 1, before taking off. The thickness of the second layer 3B and the third layer 3A are greater than or equal to the thickness of the useful layer. The material forming the first layer 2 is chosen such that there is at least one method of removing material with a capacity to attack the material forming the first layer 2 significantly different from the capacity to attack the material in at least one of the two layers 3A and 3B, at their corresponding interfaces to permit selective removal.

In one embodiment, the thickness of the first layer 2 is at least as great as the thickness of a useful layer to be taken off. The result is then a configuration similar to one of those described above. In a second embodiment, the crystallographic structure of layers 3A and 3B, and particularly the lattice parameters, are almost identical, and it is undesirable for the first layer 2 to significantly disturb the crystallographic structure of its adjacent layers 3A and 3B. In particular, it would be undesirable to disturb the crystalline growth of the second overlying layer 3B during its formation on the first layer 2, for which the lattice parameter must be approximately the same as the lattice parameter for the part 3A subjacent to the first layer 2.

In another embodiment, the first layer 2 is elastically constrained so that its lattice parameter is almost identical to the lattice parameter of layer 3A subjacent to it, even if the lattice parameter of the material in this layer is significantly different from the lattice parameter of the first layer 2. The nominal parameter of the first layer 2 and the lattice parameter of the zone subjacent to it (included within the third layer 3A) are similar to each other, to prevent the appearance of defects (such as dislocations or local stresses) in the first layer 2. The first layer 2 must be sufficiently thin to prevent progressive relaxation of the elastic strain through the thickness of the layer or the generation of defects. To achieve this, the thickness of such a first layer 2 formed of an elastically strained semiconductor material must be less than a critical thickness known to one skilled in the art, and depending particularly on its component materials, of the materials in the layers adjacent to it, and techniques for making the strained layer.

Critical thicknesses typically encountered for a Si layer 2 between two layers 3A and 3B of SiGe (50%-50%) are approximately a few tens of nanometers.

In a second embodiment of the first layer 2, a material is chosen for the first layer 2 with a nominal lattice parameter nearly the same as the lattice parameter of the materials from which the zones adjacent to it are made. Thus, unlike the first embodiment, the crystallographic structure of the first layer 2 in this case is significantly relaxed.

Consequently, and also to satisfy a selectivity criterion during removal of material applied during the first recycling step, the material for the first layer 2 will be chosen such that it has at least one constituent element that is not in at least one of the materials adjacent to it. The material in the first layer 2, however, has a lattice parameter similar to the lattice parameter of adjacent zones, this constituent element is then the essential element that will determine selectivity with respect to the adjacent layer considered during selective removal of material. In one case, no constituent element of the material in the first layer 2 is present in the material making up the adjacent zone concerned by selective removal of material, and the two materials are then entirely different. In another case, every constituent element in the first layer 2 that is different from the adjacent zone concerned by selective removal of material may be an additional element or an element that does not exist in the adjacent layer being considered.

For example, a first layer 2 with approximately the same lattice parameter as adjacent zones could be doped, so that this lattice parameter is not significantly disturbed after doping. If the first layer 2 is formed of the same material as the material from which the adjacent zone by the selective removal of material is made, this doping element is the element that will determine the selectivity capacity. When doping the first layer 2, the thickness of the first layer 2 may in some cases remain less than a critical thickness known to those skilled in the art, if defects such as dislocations, and particularly through dislocations, are not wanted.

In a third embodiment of the first layer 2, the layer 3A made previously is made porous on the surface in order to make a porous layer. This increase in porosity may be applied by anodization or by any other porosity technique, such as that described in EP0 849 788 A2.

This layer of porous material may make a first layer 2, if at least one adjacent material can be selectively attacked using an appropriate attack method. The porosity does not significantly disturb the crystallographic structure of these two adjacent layers, such that a first layer 2 does not significantly disturb the crystallographic structure of the donor wafer 10. The result is a crystallographic structure of the first layer 2 that is very similar or identical to the crystallographic structure of the zones adjacent to it, such that the first layer 2 does not disturb the crystallography of the surrounding structure.

Alternatively, there may be a first layer 2 with a specific influence on the lattice parameter of the surrounding structures, the state (strained or relaxed, complete or relative) that the first layer 2 may induce in adjacent layers, in these cases represents a property considered to have very little advantage for the following application.

With reference to FIGS. 2b and 2c, part of the layer 3B is taken off and transferred onto a receiving substrate 5 according to a taking off method similar to those described above with reference to FIGS. 1b and 1c. After taking off and during recycling, selective removal of material applied at the first layer 2 includes at least one of the following selective removals of material: as shown in FIG. 2d, selective removal of the material in the layer 3B' adjacent to the first layer 2, the first layer 2 forming a stop layer for removal of material; after removal of layer 3B', selective removal of the material in the first layer 2, the material in the third layer 3A adjacent to the first layer 2 forming a stop layer for removal of material.

In one particular method of selective removal, two successive selective removals of materials may be combined at the first layer 2. In this case, the second layer 3B, and then the first layer 2 are selectively removed.

Regardless of the method chosen for selective removal of material in the first recycling step and the method chosen to remove the part of the donor wafer 10 on the same side as the useful layer, there is a stop layer for removal of material (the first layer 2 in the case of the first selective removal of material or the zone subjacent to the first layer 2 included in the third layer 3A in the case of the second selective removal of material). The stop layer acts as a barrier for material attack, and in particular protects the third layer 3A in which there is a new useful layer to be taken off during a later taking off.

In embodiment, the donor wafer 10 includes several triplets formed of the first layer 2, second layer 3B, and the third layer 3A. The second layer 3B or the first layer 2 of each triplet may be removed selectively with respect to the layer subjacent to them, and form part of the same triplet, by removing the material selectively. Preferably, there is also a method of removing material in a third layer 3B of a triplet selectively with respect to a layer subjacent to it that is also included in the multi-layer structure I. This embodiment has the advantage that any layer in a triplet of layers can be selectively removed during recycling.

Figure 4:
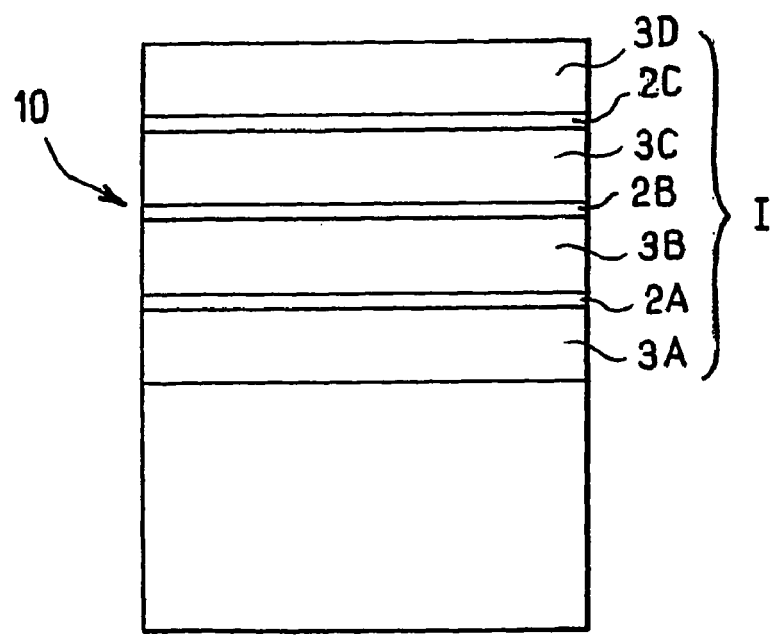
FIG. 4 shows a second donor wafer according to the invention.

In this embodiment, the layer subjacent to the third layer 3B is a second layer 3A belonging to another triplet of layers. Alternatively, the layer subjacent to the third layer 3B is a first layer 2 that does not belong to the same triplet as layer 3B. In this case, the first layer 2 in the triplet overlying it and to which the third layer 3B belongs is preferably inserted with another triplet subjacent to it. In this case, the result is an assembly formed from a sequence of type 3A layers and type 3B layers separated by a type 2 layer. An example of a particular configuration of a multi-layer structure I that several such triplets of layers is shown in FIG. 4, in which the multi-layer structure I includes a first triplet formed of a layer 2A inserted between a layer 3A and 3B as shown in FIG. 2a; a second triplet formed of a first layer 2C inserted between a layer 3C and 3D as shown in FIG. 2a; and a layer 2B inserted between the two triplets. The thickness of each of the layers 3A, 3B, 3C and 3D is at least the thickness of the useful layer to be taken off. The first function of the layers 2A, 2B and 2C is to protect the layer subjacent to them from removal of material applied during recycling by forming a stop layer to selective removal of the layer overlying it during recycling; or by forming a layer to be removed selectively with respect to the layer subjacent to it. Therefore, in this configuration of a donor wafer 10, there are layers 3A, 3B, 3C, and 3D in which useful layers can be taken off, separated by protection layers 2A, 2B, and 2C respectively protecting the layers subjacent to them during recycling.

Therefore, according to one process of the invention, one or more layers may be taken off in one or more steps, with one or more intermediate recycling operations by selective removal of the part of the layer remaining after taking off with respect to the first protection layer encountered (2A, 2B or 2C), this layer thus protecting a layer subjacent to it and that includes at least one useful layer that can be taken off. Thus, with this configuration it is possible to take off useful layers formed by one or more sub-layers of materials.

When several layers are taken off, at least one protection layer or part of a protection layer such as layers 2A, 2B and 2C are also taken off. This layer may act as a protection layer when selectively removing material when the surface of the taken off useful layer is being finished rather than during recycling, particularly to remove surface roughness.

In general, and for a multi-layer structure I according to the invention in which several useful layers can be taken off between the recycling steps, a cyclic process for taking off useful layers from a donor wafer 10 is used by performing the following steps iteratively in turn: a taking off process and a recycling process. Before the cyclic taking off method is applied, a process for making the donor wafer 10 may be implemented with one or several techniques for making thin layers on the substrate I described above.

The taking off may be repeated several times starting from a donor wafer 10 (such as one of those shown in FIGS. 1a, 2a, 3, or 4) in the same structure I made on substrate 1 without necessarily forming additional layers or without necessarily applying a treatment to retrieve at least part of the substrate 1. This saves time with implementation of the global taking off process, and makes implementation of the process easier and significantly less expensive than the different processes according to the state of the art.

The number of taking off operations performed on the multi-layer structure is a function of the thickness of the multi-layer structure. Eventually, the remaining multi-layer structure I is no longer sufficiently thick to contain a useful layer to be taken off. In a first case, the donor wafer 10 is thrown away and in this case the entire substrate 1 is lost. This makes the substrate may be complex, longer, and more expensive, particularly if the substrate 1 includes a buffer structure.

In another embodiment, at least part of the substrate 1 is recovered using a recycling process. If the substrate 1 includes a buffer structure, three types of recycling of the substrate 1 may be applied. A recycling process that includes removal of the entire buffer structure, but in which it is possible to keep at least part of the support substrate on which the buffer structure was formed, may be used. This recycling causes loss of part of the substrate 1, however, which is usually the most difficult and most expensive to make and requires the use of an additional step to form a buffer structure. For example, it may be required to reform a substrate 1 equivalent to the substrate before recycling.

A recycling process that includes removal of part of the buffer structure, and is capable of keeping the support substrate on which the buffer structure was formed and part of the buffer structure, such as a buffer layer that is expensive to make, may be used. For example, when recycling is finished, selective removal of material is possible beginning with a stop layer judiciously located in the buffer structure. An additional step to reform a buffer structure is preferably applied if required to reform a substrate 1 equivalent to the substrate before recycling.

A recycling process that includes the removal of at least part the remainder of the original multi-layer structure I, to keep the entire substrate I may be used. A finishing step for the rest of the multi-layer structure I may be applied during recycling. The finishing step may include, for example, CMP, heat treatment, sacrificial oxidation, bombardment, or other smoothing technique, or a selective material removal may be applied using a stop layer judiciously located between the multi-layer structure I and the substrate 1.

After recycling of the substrate 1, a new multi-layer structure I is formed in which several useful layers may be taken off according to a process of the invention. This new multi-layer structure I may be similar to the structure before recycling. This new multi-layer structure I may have a slightly different structure from the multi-layer structure I before recycling, by slightly modifying some manufacturing parameters. For example, the concentrations of some compounds in a material may be slightly modified. In all cases, the multi-layer structure is preferably made by growth of layers, for example by epitaxy using CVD or MBE.

In one embodiment, the growth of at least one layer within the multi-layer structure I is done in situ, directly in continuation with the formation of the subjacent growth support, the subjacent growth support in this case also advantageously being formed by layer growth. In a second embodiment, at least one of these layers is grown after a slight finishing step on the subjacent growth support surface, such as by CMP polishing, heat treatment, or other smoothing technique.

In the remainder of this application, example configurations of donor wafers 10 are presented that include multi-layer structures I that can be implemented by a process according to the invention. In particular, different materials will be presented that can advantageously be used in such donor wafers 10. Some of the examples may include a buffer structure and a support substrate in the substrate 1, the buffer structure being formed on the support substrate. In some of the examples, the buffer structure has a first lattice parameter at the level of its support substrate and a second lattice parameter close to its interface with the subjacent multi-layer structure I. This type of buffer structure includes a buffer layer to make such an adaptation of the lattice parameter.

The first technique for making a buffer structure (as described above), usually used to obtain a buffer layer with this property, is to have a buffer layer formed by several atomic elements, wherein at least one atomic element is included in the composition of the support substrate, and at least one atomic element that is not located in the support substrate at all, or only slightly, with a concentration that varies gradually through the thickness of the buffer layer. The gradual concentration of this element in the buffer layer will be the main cause of the gradual variation of the lattice parameter in the buffer layer, metamorphically.

Thus, in this configuration, a buffer layer is mainly an alloy. The atomic elements chosen for the composition of the support substrate for the buffer structure and the buffer layer may be of atomic element Group IV, such as Si or Ge.

For example, this embodiment includes a Si support substrate and a SiGe buffer layer with a concentration of Ge that varies gradually through the thickness between a value close to 0 at the interface with the support substrate and a determined value on the other face of the buffer layer. In another case, the composition of the support substrate or the buffer layer may include a pair of Group III-V atomic elements, such as a pair chosen from possible combinations of (Al, Ga, In), (N, P, As).

For example, one embodiment includes a support substrate of GaAs and a buffer layer of As and Ga and at least one other element, and varying gradually in thickness between a value close to 0 at the interface with the support substrate and a determined value on the other face of the buffer layer. The composition of the support substrate or the buffer layer may include a pair of Group II-VI atomic elements, such as a pair chosen among possible combinations of (Zn, Cd), (S, Se, Te).

EXAMPLES

The first five examples deal particularly with donor wafers 10 that include a support substrate 1 made of Si and a buffer layer made of SiGe or Si and other layers of Si and SiGe within the multi-layer structure I. These wafers 10 are particularly useful when taking off layers of strained SiGe and/or Si to make SGOI, SOI or Si/SGOI structures. In this context, the etching solutions used are different depending on the material (Si or SiGe) to be etched. Thus, etching solutions suitable for etching these materials will be classified in categories, assigning an identifier taken from the following list to each category:

(A) S1: selective etching solutions of Si with respect to SiGe such that a solution includes at least one compound among KOH, $NH_4OH$ (ammonium hydroxide), TMAH, EDP, or $HNO_3$, or solutions combining agents such as $HNO_3$, $HNO_2H_2O_2$, HF, $H_2SO_4$, $H_2SO_2$, $CH_3COOH$, $H_2O_2$, and $H_2O$ as disclosed in WO 99/53539, page 9.

(B) S2: selective etching solutions of SiGe with respect to Si such as a solution including HF, $H_2O_2$, $CH_3COOH$ (selectivity about 1:1000), or HNA (hydrofluoric-nitric-acetic solution).

(C) Sc1: selective etching solutions of SiGe with a concentration of Ge significantly less than or equal to 20%, with respect to SiGe with a concentration of Ge equal to or greater than 25%, such as a solution containing TMAH or KOH.

(D) Sd1: selective etching solutions of undoped Si with respect to boron doped Si, preferably doped to more than $2\times10^{19}$ $cm^{-3}$, such as a solution containing EDP (ethylene diamine and pyrocathechol), KOH, or $N_2H_2$ (hydrazine).

Example 1

The donor wafer 10 is formed of a substrate 1 formed of a support substrate made of Si; a buffer structure formed of SiGe made according to the first technique for making a buffer structure, and including a buffer layer and an additional layer; and a multi-layer structure I that includes SiGe. The concentration of Ge in the buffer layer preferably increases progressively from the interface with the support substrate, to vary the SiGe lattice parameter as explained above. The thickness is typically about 1 to 3 micrometers for surface concentrations of Ge of less than 30% to obtain a good structural relaxation at the surface, and to confine defects related to the difference in the lattice parameter such that they are buried.

The additional layer is made of SiGe significantly relaxed by the buffer layer, with an advantageously uniform concentration of Ge almost identical to the concentration of the buffer layer close to their interface.

The concentration of germanium in the silicon within the relaxed SiGe layer is typically about 15% to 30%. This upper limit of 30% represents a typical limitation of current techniques, but it may vary in future years. The thickness of the additional layer may vary widely depending on the case, with a typical thickness of about 0.5 to 1 micron.

As shown in FIG. 2a, the multi-layer structure I before taking off preferably includes a triplet of the following layers: layer 3A made of substantially relaxed SiGe with a thickness greater than the thickness of a useful layer to be taken off; a layer 2 on layer 3A; and a layer 3B on the substantially relaxed SiGe layer 2 and with a thickness greater than the thickness of a useful layer to be taken off.

Layer 2 is formed of one of strained Si or strained SiGe. Where the layer 2 is formed of strained Si or SiGe, the thickness of this layer 2 must not exceed a critical thickness. For a layer 2 made of strained Si inserted between two layers of SiGe with a concentration of Ge of about 20%, the critical thickness is typically of the order of about 20 nanometers.

Several types of etching may preferably be used after taking off part of layer 3B, depending on the material in layer 2. If the layer 2 is made of strained Si, the overlying part made of SiGe is etched selectively with an S2 type solution, or after the layer 3B remaining after taking off has been removed, the layer 2 is etched selectively with an S1 type solution. If layer 2 is made of strained SiGe with a concentration of Ge at least about 25% and the concentration of Ge in the overlying layer is up to about 20%, the overlying part made of SiGe is selectively etched with an Sc1 type solution. If layer 2 is made of SiGe with a concentration of Ge up to about 20% and the concentration of Ge in the subjacent layer is at least about 25%, after the layer 3B remaining after taking off has been removed, the layer 2 is etched selectively with a Sc1 type solution.

A layer 2 formed of SiGe or Si may also be doped with doping elements such as boron or phosphorus, in order to improve the selectivity of chemical etching. In one particular configuration of the multi-layer structure I, the multi-layer structure I includes several triplets of these layers 3A, 2 and 3B. In one particular embodiment, the multi-layer structure I includes only pairs of layers 2 and 3, as shown in FIG. 3. Preferably, a layer 2 separating two consecutive triplets, such as the donor wafer 10 shown in FIG. 4 will be present.

It is then preferable and convenient to find all taking off formulas involving one or several layers taken off in one or in several operations, separated by recycling processes according to the invention and preferably including selective etching between SiGe and the material in a layer 2.

Example 2

The donor wafer 10 is formed of a substrate 1 formed of a support substrate formed of Si; a buffer structure formed of SiGe made according to the first technique for making a buffer structure, and including a buffer layer formed of SiGe and an additional layer formed of Ge; and a multi-layer structure I including one or more of GaAs and AlGaAs. The concentration of Ge in the buffer layer preferably increases progressively from the interface with the support substrate, to vary the lattice parameter of the Si support substrate with respect to the lattice parameter of the additional layer made of Ge. The concentration of Ge in the buffer layer is increased from about 0 to about 100% or preferably about 98% for a complete match in the theoretical mesh between the two materials.

For example, as shown in FIG. 1a, the multi-layer structure I before taking off preferably includes the pair of layers: a layer 2 formed of AlGaAs; and a layer 3 on layer 2, layer 3 formed of substantially relaxed GaAs and with a thickness greater than the thickness of a useful layer to be taken off.

Taking off applies to the part of the multi-layer structure I above layer 2, and recycling includes selective chemical etching of layer 3 with a selective etching solution, such as a solution containing citric acid ($C_6H_8O_7$) and oxygenated water with a pH of about 6 to 7 (the selectivity coefficient is typically 20), so that almost the entire layer 3 can be taken off, in this case layer 2 behaving like an etching stop layer.

In one particular configuration of the multi-layer structure I, the multi-layer structure I includes another layer made of GaAs subjacent to layer 2. Taking off then applies to the part of the multi-layer structure I above this other GaAs layer, and recycling includes selective chemical etching of layer 2 with a selective etching solution, such as a solution that includes dilute hydrofluoric acid (between about 9% and 48%) (the selectivity coefficient is typically about 350 to 10000), so that almost the entire layer 2 can be removed, with the other subjacent GaAs layer behaving like an etching stop layer. In one case, the two selective etchings can be done one after the other in order to remove at least part of layer 3 and then to remove layer 2.

In one embodiment, the multi-layer structure includes several pairs of these layers 2 and 3. The multi-layer structure I is formed of pairs of layers 2 and 3, as shown in FIG. 3.

It is then preferable and convenient to find all taking off formulas involving one or several layers taken off in one or in several operations, separated by recycling processes according to the invention, preferably including selective etching between AlGaAs and GaAs.

Example 3

The donor wafer 10 is formed of a substrate 1 formed of Si and a multi-layer structure I that includes Si before taking-off. As shown in FIG. 2a, the multi-layer structure I before taking-off preferably includes a triplet of the following layers: a layer 3A made of substantially relaxed Si with a thickness greater than the thickness of a useful layer to be taken off; a layer 2 on layer 3A; and a layer 3B on the substantially relaxed Si layer 2 and with a thickness greater than the thickness of a useful layer to be taken off. Layer 2 is formed of one doped Si or strained SiGe. Where layer 2 is formed of strained SiGe, the thickness of this layer 2 must not exceed a critical thickness related to the Ge concentration.

Several types of etching may preferably be used after taking off part of layer 3B, depending on the material in layer 2. If the layer 2 is formed of doped Si, the overlying part formed of Si and left after taking off is selectively etched with Sd1 type solution. If the layer 2 is formed of strained SiGe, the overlying part formed of Si is etched selectively with S1 type solution, or after the layer 3B remaining after taking off has been removed, the layer 2 is selectively etched with an S2 type solution.

Example 4

The donor wafer 10 is formed of a substrate 1 formed of a support substrate made of Si and a buffer layer made using the second particular technique for making a buffer structure discussed above and in WO 00/15885.

A first layer formed of Ge or SiGe is deposited, possibly followed by deposition of a second optional layer that can improve the crystallographic quality of the overlying layer, as disclosed in WO 00/15885. The second layer is formed of SiGe (50/50), if the first layer is Ge; strained Si if the first layer in the buffer layer is made of SiGe.

The donor wafer also includes a multi-layer structure I that includes a sequence of pairs of layers, each pair formed of a relaxed layer 3 and a strained layer 2, each relaxed layer 3 is at least as thick as the a useful layer to be taken off and is formed of Ge, if the first layer of the buffer layer is formed of Ge, or SiGe if the first layer the buffer layer is formed of SiGe (with a concentration almost the same as the concentration of the first layer in the buffer layer). Each strained layer 2 is formed of strained Si or SiGe and its thickness is less than a critical thickness beyond which the elastic strain starts to relax, this critical thickness depending on the composition of the three adjacent relaxed layers made of Si. Removal of the multi-layer structure I may apply to a set of layers or a single layer of the multi-layer structure 1. Thus, a relaxed layer 3, a strained layer 2 or a set of strained layers 2 and relaxed layers 3 may be taken off, to transfer them onto a receiving substrate 5.

If taking off takes place in a relaxed layer 3, recycling according to the invention can be implemented by chemically etching the remaining relaxed layer 3 with a solution capable of etching the material in the layer 3 selectively with respect to the material in layer 2. If layer 2 is formed of Si and layer 3 is made of SiGe, the strained layer 2 will be etched with S2 type solution, the strained layer 2 then being an etching stop layer. This etching may be followed by a second etching of the strained layer 2 that is selective with respect to another relaxed layer. It is thus possible to implement a second taking off after a first taking off, the second taking off applying to the strained layer 2 or part of the subjacent multi-layer structure I.

Note that the structures obtained after taking off according to this example are free of any dislocation type defects, even in a buried region. The structures obtained as a result may then be used to grow additional layers, for example, formed of strained silicon, by epitaxy on the layer made of strained SiGe, Ge or Si.

Example 5

The donor wafer 10 is formed of a substrate 1 formed of a support substrate formed of Si; a buffer layer formed of Si according to the third technique for making a buffer structure; and a multi-layer structure I that includes a triplet of the following layers: (1) a first layer 3A formed of SiGe with at least 15% of Ge on the buffer structure, the SiGe being relaxed or pseudo-relaxed; (2) a second layer 2 formed of strained Si with a thickness much less than the cumulative thickness of the first layer 3A and the second layer 3B; and (3) a third layer 3B formed of SiGe and including at least 15% of Ge, the SiGe being relaxed or pseudo-relaxed. This donor wafer 10 is obtained after making the buffer layer according to the third technique for producing the buffer structure.

In a first embodiment of the buffer layer, the triplet of layers was present before the buffer layer was made. The donor wafer 10 is in the form of a substrate 1 formed Si; and a multi-layer structure I' formed of the following layers: (1) a first layer 3A' formed of SiGe with at least 15% of Ge on the buffer structure, the SiGe being strained; (2) a second layer 2' formed of relaxed Si; and (3) a third layer 3B' formed of SiGe that includes at least 15% of Ge, the SiGe being strained. The strained SiGe layer 3A' has nearly the same characteristics as the strained SiGe layer 3B'.

The density of defects such as dislocations in the multi-layer structure I' is preferably less than about $10^7$ cm$^{-2}$. Typical thicknesses of a multi-layer structure I' with layers 3A' and 3B' with 15% of Ge and a multi-layer structure I' with layers 3A' and 3B' with 30% Ge, are about 250 nm and about 100 nm respectively, thus remaining below the critical end of elastic strain thickness for each layer. The typical thickness of the relaxed layer 2' is a few tens of nanometers. The orders of magnitude of the thicknesses of the strained layers 3A' and 3B' are preferably nearly the same as each other. Therefore, the multi-layer structure I' is globally strained.

The buffer layer will be made by the following steps: formation of a disturbance area in the support substrate 1 formed of Si by the implantation of atomic species such as H or He; and heat treatment to cause at least relative relaxation of elastic strains in the multi-layer structure I'.

Implantation energy ranges of H and He used during the first step are typically about 12 to 25 keV. Implanted H or He doses are typically about $10^{14}$ to $10^{17}$ cm$^{-2}$. Thus for example, for a strained layer 3A' with 15% of Ge, H will preferably be used for the implant at a dose of about $3\times10^{16}$ cm$^{-2}$ with an energy about 25 keV. For a strained layer with 2% to 30% of Ge, He will preferably be used for the implant at a dose of about $2\times10^{16}$ cm$^{-2}$ with an energy about 18 keV. Implant depths of atomic species in the substrate 1 are also typically about 50 nm to 100 nm.

The heat treatment applied during the second step must be adapted so that disturbances are displaced in the region between the disturbance zone and the multi-layer structure I'. This region in which disturbances are displaced will then form the buffer layer.

The arrival of dislocations at the interface between the buffer layer and the multi-layer structure I' causes a global relaxation of the multi-layer structure I' as follows: elastic relaxation of the strained layer 3A' to form the relaxed or pseudo-relaxed layer 3A; elastic strain in the relaxed layer 2' to form the strained layer 2, this layer having a lattice parameter nearly the same as the lattice parameter of the subjacent relaxed SiGe; and elastic relaxation of the strained layer 3B' to form the relaxed or pseudo-relaxed layer 3B. The movement of dislocations in the buffer layer also causes a large disappearance of dislocations in the multi-layer structure I'.

The heat treatment is preferably implemented under an inert atmosphere. However, the heat treatment may be applied under another atmosphere, such as an oxidizing atmosphere. A particular heat treatment to be applied for this type of donor wafer 10 will be made at temperatures of typically about 400° C. to 1000° C. for about 30 s to 60 minutes, preferably about 5 minutes to about 15 minutes.

In a second embodiment of the buffer layer, the triplet of layers were not present before the buffer layer was made. The donor wafer preferably includes a Si substrate 1 and a layer formed of SiGe including at least 15% of Ge, the SiGe being elastically strained. Relaxation techniques and parameters for this SiGe layer are nearly the same as for the first embodiment of the buffer layer.

The next step after the buffer layer has been made is to grow layers forming the multi-layer structure that includes the triplet of globally relaxed layers. The multi-layer structure I is thus made after the buffer layer, unlike in the first embodiment proposed in this example. For further information about experimental techniques, refer to studies done by B. Holländer et al., "Strain relaxation of pseudomorphic Si$_{1-x}$Ge$_x$/Si(100) heterostructures after hydrogen or helium ion implantation for virtual substrate fabrication" (in Nuclear and Instruments and methods in Physics Research B 175-177 (2001) 357-367).

After the wafer 10 has been bonded onto a receiving substrate 5 on the relaxed layer 3B, taking-off is performed with or without an intermediate bonding layer using one or more of the known techniques described above. Some of the relaxed SiGe layer 3B is taken off. Recycling is preferably done by selective chemical etching of the residue of layer 3B using a type S2 solution, layer 2 then forming an etching stop layer. A second selective chemical etching step of layer 2 can then be applied using S1 type solution, the layer 3A forming an etching stop layer. The result is a recycled donor wafer 10 that can give a new useful layer in layer 3A or a pair of layers 2/3A, by taking off.

Example 6

The donor wafer 10 is formed of a substrate 1 formed of a support structure at least part of which is formed of GaAs at its interface with the overlying buffer structure, a buffer structure formed of Group III-V material made according to the first buffer structure manufacturing technique, and a multi-layer structure I formed of a Group III-V material before taking-off. The support structure may be formed of solid GaAs or solid Ge, on which a thickness of GaAs is epitaxially grown.

The first advantage of the buffer structure is to adapt the lattice parameter with the material of the multi-layer structure I close to their interface (which for example may have a nominal value of 5.87 Angstroms in the case of InP), to the value of the GaAs (for which the nominal value is about 5.65 Angstroms).

In solid Group III-V materials, the practical advantage of such a buffer structure may become clear by comparing different materials such as solid InP and solid GaAs. For example solid GaAs is less expensive, more easily available on the semiconductors market, less weak mechanically, with the use of the best known rear face contact technologies, and available in larger sizes (typically 6 inches instead of 4 inches for solid InP) than for solid InP.

The electronic performances of InP, however, are usually more useful than the electronic performances of GaAs. Thus, the donor wafer 10 gives a solution for the manufacture of a 6-inch InP layer, by proposing a multi-layer structure I formed of InP on an GaAs support substrate and relaxed through a buffer structure.

Therefore, the possible advantages of such a donor wafer 10 become evident—it can be used to make an active layer made of a known Group III-V material to be transferred with determined quality and properties, for example that may be similar to the properties that could have been obtained if solid Group III-V material had been used.

The thickness of the buffer structure included within this type of donor wafer 10 is typically more than one micron, and this thickness will increase, particularly if it is possible to avoid destroying it after each taking off operation due to the use of a recycling process according to this invention.

In the example of the multi-layer structure I formed of InP essentially relaxed at its interface with the subjacent buffer structure, the buffer structure of the substrate 1 then preferably includes a buffer layer formed of InGaAs with a concentration of In of about 0 to about 53%. The buffer structure may also include an additional layer made of a Group III-V material such as InGaAs or InAlAs, with an almost constant concentration of atomic elements.

In one embodiment, at least one InP layer is taken off in the multi-layer structure I so that it can be transferred onto a receiving substrate 5. Thus, any electrical and electronic properties can be well used. For example, this is the case if the taken off part also includes InGaAs or InAlAs; discontinuities in electronic bands between the latter material and the InP create significantly better electronic mobilities in the taking off layers. Other configurations of donor wafers 10 are possible, including other Group III-V compounds. Typical applications for these means of taking off layers include HEMT (High Electron Mobility Transistor) and HBT (Heterojunction Bipolar Transistor) implementations. Chemical etching solutions, possibly selective and adapted to remove some Group III-V materials and not other Group III-V materials, are preferably used during recycling. Thus, for example, selective etching of InP is preferably used with a solution formed of concentrated HCl in order to remove an InP layer without taking off a subjacent layer of InGaAs.

Example 7

The donor wafer 10 is formed of a substrate 1 formed of a support substrate formed of GaAs at its interface with the overlying buffer structure; a buffer structure made according to the first technique for making a buffer structure, and including InGaAs at its interface with the multi-layer structure I; and a multi-layer structure I formed of InP or $In_xGa_{1-x}As_yP_{1-y}$ before taking-off.

With reference to FIG. 1a, the multi-layer structure I before taking off Preferably includes the pair of the following layers: a layer 2 made of InGaAs (P) and a layer 3 on layer 2, layer 3 being formed of substantially relaxed InP and with a thickness greater than the thickness of a useful layer to be taken off. This type of donor wafer 10 was described in example 6 above.

Taking off applies to the part of the multi-layer structure I above layer 2, and recycling includes selective chemical etching of layer 3 with a selective etching solution, such as a solution that includes HF so that almost the entire layer 3 left after taking-off can be removed, in this case layer 2 behaving like an etching stop layer.

In one embodiment, the multi-layer structure I includes another layer of InP subjacent to layer 2. Taking off then applies to the part of the multi-layer structure I above this other InP layer, and recycling includes selective chemical etching of layer 2 with a selective etching solution, such as a solution that includes $Ce^{IV}H_2SO_4$, so that almost the entire layer 2 is removed, in this case the other subjacent InP layer behaving like an etching stop layer.

In another case, the two selective etchings can be done one after the other in order to remove at least part of layer 3 and to remove layer 2. In one particular configuration of the multi-layer structure I, the multi-layer structure I includes several pairs of these layers 2 and 3. The multi-layer structure I may include only pairs of layers 2 and 3, for example as shown in FIG. 3. It is then preferably and convenient to find all taking off formulas involving one or several layers taken off in one or in several operations, separated by recycling processes according to the invention preferably including selective etching between InP and InGaAs (P).

Example 8

The donor wafer 10 is formed of a substrate 1 formed of a support substrate formed of sapphire, SiC, or Si, a buffer structure made according to the first technique for making a buffer layer, and a multi-layer structure I formed of nitride layers. The buffer structure is formed of a metamorphic buffer layer of $Al_xGa_{1-x}N$, where x varies in thickness from 0 to 1 starting from the interface with sapphire, and an additional layer of GaN to confine dislocation type crystallographic defects.

The Group III-V GaN, AlN and InN nitrides are useful in microelectronics, particularly in light emitting devices such as lasers, for applications such as reading or writing data stored at high density on compact disks or such as light emitting diodes for new display technologies. These materials are also suitable for making high power electronic components, or electronic components operating at high temperature.

One method of making the nitride layers included in the multi-layer structure I is epitaxial growth on the additional layer of GaN by deposition of Group I organic metals, such as Trimethyl Gallium, Trimethylamine Alane, or Trimethyl Indium for the deposition of the GaN, AlN, or InN layers, respectively. This invention used to transfer several of these nitride layers starting from the same donor wafer 10 implies a recycling step between each operation to take off a layer, in order to prepare another layer in the multi-layer structure I for another taking off operation. Thus, several techniques, mainly smoothing of layers by chemical etching, help to achieve this purpose while keeping the structural and geometric quality of the layer to be taken off intact or almost intact. One example is a photo etching technique used to etch layers of GaN, as disclosed in R. T. Leonard et al., "Photo-assisted dry etching of GaN", in Applied Physics letters 68 (6), Feb. 5, 1996.

In the present example, the multi-layer structure I including nitrides is similar to that shown in FIGS. 2 and 4. As shown in FIG. 2a, the multi-layer structure I before taking off preferably includes a triplet formed of a layer 3A of AlN, a layer 2 of InN, and a layer 3B of GaN. Preferably, the multi-layer structure I includes another almost identical triplet of layers, separated from the first triplet by a layer of InN.

The advantage of this three-layer structure lies in the choice of materials for which chemical attack means are available that are significantly different for each of the materials. Thus, InN has a lower dry etching rate than GaN or AlN if a plasma gas that includes polarized chlorine, hydrogen, and possibly argon is injected on the wafer 10, particularly adapting the technical parameters as follows: power of polarizing radio frequencies preferably about 400 to 1000 Watts, more preferably about 650 Watts; temperature of about 500° to 1000°K, preferably closer to 1000°; low pressure on the order of 1 mT; and composition with $Cl_2$ to $H_2$ ratio on the order of 2 to 3, for a total fluidic ratio of about 25 sccm.

The etching selectivity of GaN and AlN compared with InN is mainly due to the low volatility of $InCl_x$ species compared with the volatility of species containing Ga and Al. N atoms in nitrides combine very well with $H_2$ to form gaseous molecules of $NH_3$. With reference to the experimental results obtained by S. J. Pearton et al. in "Law Bias Electron Cyclotron Resonance Plasma Etching of GaN, AlN and InN" (Applied Physics Letters 64 (17), Apr. 25, 1994), the etching ratio of GaN with respect to InN may be more than 3 to 1, and the etching ratio of AlN with respect to InN may be of the order of 5 to 1. An etching ratio of GaN with respect to AlN on the order of 2 to 1 can be obtained, and a dry etching ratio of InN with respect to AlN of the order on 3 to 2 can be obtained.

If taking off is done in the GaN layer, a gas including polarized chlorine may preferably be used so that the subjacent layer of InN forms an etching stop layer. If it is not required to keep the InN layer, dry etching can be applied using a gas containing $CH_2$, so that the subjacent layer of AlN forms an etching stop layer.

An additional finishing step, for example polishing, may be used to finish the surface of the layer kept after etching. This layer kept after etching may then be taken off again. Similarly, if taking off is done in the InN layer, the residue of the InN layer can advantageously be dry etched using gas containing $CH_2$ so that the InN layer forms a stop layer. If it is not required to keep the layer made of AlN, dry etching using gas including chlorine may be used so that the subjacent InN layer forms a stop layer. Finally, if a layer made of AlN is taken off, dry etching can advantageously be used using chlorine gas while the subjacent InN layer forms a stop layer. Several layers may also be taken off in a single taking off operation, particularly if there are several triplets (AlN, InN, GaN) separated by an InN layer.

Example 9

The donor wafer 10 is formed of a substrate 1 formed of a support substrate formed of sapphire or SiC or Si; an intermediate layer formed of GaN; a $SiO_2$ mask; a GaN buffer layer; and a multi-layer structure I that includes successive layers of nitrides, including at least one layer of GaN.

The method of making the buffer layer is as described above for the fourth technique for making the buffer structure, and includes anisotropically growing nitride layers, particularly GaN, using the ELOG technique. The SiO$_2$ mask used in this configuration is preferably in the form of bands arranged periodically on the intermediate layer of GaN, and nearly parallel to each other. The thickness of each band is typically of the order of a few tens of a micron, while the width of a band is of the order of a few microns. The distance separating the bands from each other is typically about 10 microns or 15 microns. For example, there could be a network of bands at 13 micron intervals, each band being 0.2 microns thick and 5 microns wide.

As described above in a general case, these SiO$_2$ bands will cause localized dislocations in the GaN layer(s) deposited above, close to the free surface of these bands. The thickness of GaN in which these dislocations are located around the mask then forms the buffer layer. The layers of GaN or other materials with lattice parameters similar to the lattice parameters of GaN are deposited on the buffer layer to form the multi-layer structure I. The multi-layer structure I includes at least two layers each with a thickness equal to or greater than the thickness of a useful layer that is to be taken off. Further information about the method of making a wafer according to the ELOG process is disclosed in "MRS Bulletin" May 1998, volume 23, No. 5, Article by Shuji Nakamura entitled "In/GaN/AlGaN-Based Laser Diodes with an Estimated Lifetime of Longer than 10,000 Hours".

In particular, in this multi-layer structure I, stop layers with selective chemical etchings such as InN layers as described in example 8 may be integrated during manufacturing. Thus, after taking off a layer of GaN, recycling according to the invention may be include selectively etching the GaN with respect to the subjacent InN layer using an etching gas containing polarized chlorine as described in example 8. Other constituents may be added into the semiconductor layers, such as carbon with a carbon concentration in the layer significantly less than or equal to about 50%, preferably less than or equal to about 5%.

Finally, this invention is not restricted to a donor wafer 10 made of materials presented in the above examples, but also covers other types of materials belonging to Groups II, III, IV, V or VI and to alloys belonging to Groups IV-IV, III-V, II-VI. In the case of alloy materials, the alloys chosen may be binary, ternary, quaternary, or higher degree. If the donor wafer 10 includes a buffer layer or a buffer structure, this invention is not limited to a buffer layer or a buffer structure which has the prime function of adapting the lattice parameter between two adjacent structures with different lattice parameters, but also concerns any buffer layer or buffer structure as defined more generally in this document. Furthermore, the final structures obtained as a result of taking off useful layers are not restricted to SGOI, SOI, Si/SGOI structures, nor are they restricted to structures for HEMT and HBT transistors nor to structures for applications in lasers.

It is to be understood that the invention is not to be limited to the exact configuration as illustrated and described herein. Accordingly, all expedient modifications readily attainable by one of ordinary skill in the art from the disclosure set forth herein, or by routine experimentation therefrom, are deemed to be within the spirit and scope of the invention as defined by the appended claims.

What is claimed is:

1. A method of transferring layers from a donor wafer which comprises:
    forming a multi-layer structure on a surface of the donor wafer at a thickness sufficient to provide multiple layers, each layer adapted for subsequent detachment from the donor wafer;
    forming a buffer structure on the donor wafer, wherein the buffer structure includes a support substrate and a buffer layer between the support substrate and the multi-layer structure;
    detaching one layer of the multi-layer structure at a zone of weakness for transfer as a first layer while leaving behind a remaining portion of the multi-layer structure on a surface of the donor wafer that includes at least one additional layer; and
    removing material from the zone of weakness of the remaining portion of the multi-layer structure to provide a planarized surface for subsequent detachment of one of the at least one additional layer of the multi-layer structure,
    wherein the buffer layer is formed by epitaxial growth of a superficial layer on the support substrate by:
    stabilizing the support substrate to a predetermined first temperature;
    chemical vapor phase depositing of a base layer at the said predetermined first temperature to a predetermined thickness that is less than a desired final thickness;
    increasing the predetermined first temperature to a second predetermined temperature; and
    chemical vapor phase depositing additional material at the predetermined second temperature until the desired final thickness of the superficial layer is obtained;
    wherein the buffer layer is that portion of the superficial layer that interfaces with the support substrate and extends over a thickness for which the rate of crystallographic defects is greater than a limit value, with the remaining portion of the superficial layer being at least a portion of the multi-layer structure.

2. The method of claim 1, wherein the first predetermined temperature is about 400° C. to 500° C., and the second predetermined temperature is about 750° C. to 850° C.

3. A method of transferring layers from a donor wafer which comprises:
    forming a multi-layer structure on a surface of the donor wafer at a thickness sufficient to provide multiple layers for subsequent detachment;
    detaching one layer of the multi-layer structure for transfer as a first layer while leaving behind a remaining portion of the multi-layer structure; and
    removing material from the remaining portion of the formed multi-layer structure to provide a planarized surface for subsequent detachment of an additional layer;
    wherein a buffer layer is formed by epitaxial lateral overgrowth (ELOG) on a support substrate comprising at the surface a mask in relief according to specific patterns, the buffer layer being the thickness of the layer deposited by lateral epitaxy in which defects are confined relative to the layers deposited by lateral epitaxy thereon, which layers represent the multi-layer structure.

4. The method of claim 3, wherein the specific patterns of the mask are periodically spaced electrically insulating bands that are substantially mutually parallel and sufficiently fine to not perturb the ELOG.

5. The method of claim 3, wherein the support substrate comprises a solid substrate; an intermediate layer having a lattice parameter close to the nominal lattice parameter of the material deposited by ELOG; or the mask.

6. The method of claim 3, wherein the buffer layer is formed by:
forming an elastically stressed layer on the donor wafer;
forming a perturbation zone, capable of forming structural perturbations, at a given depth; and
supplying energy to bring about an at least relative relaxation of at least part of the elastically stressed layer, with the relative relaxation taking place across a region delimited by the perturbation zone and by the stressed layer, this region also confining crystallographic defects and representing a buffer layer.

7. The method of claim 6, wherein the perturbation zone is formed by implantation of atomic species.

8. The method of claim 7, wherein the implanted atomic species comprise at least in part comprises hydrogen or helium.

9. The method of claim 6, wherein the supplied energy is thermal energy.

10. A method of transferring layers from a donor wafer which comprises:
forming a multi-layer structure on a surface of the donor wafer at a thickness sufficient to provide multiple layers, each layer adapted for subsequent detachment from the donor wafer;
forming a buffer structure on the donor wafer, wherein the buffer structure includes a support substrate and a buffer layer between the support substrate and the multi-layer structure;
detaching one layer of the multi-layer structure at a zone of weakness for transfer as a first layer while leaving behind a remaining portion of the multi-layer structure on a surface of the donor wafer that includes at least one additional layer; and
removing material from the zone of weakness of the remaining portion of the multi-layer structure to provide a planarized surface for subsequent detachment of one of the at least one additional layer of the multi-layer structure,
wherein the buffer structure further comprises an additional layer, and the method further comprises, before the formation of the multi-layer structure, forming of an additional layer having a sufficient thickness to confine defects or a surface lattice parameter that is substantially different from that of the substrate.

11. A method of transferring layers from a donor wafer which comprises:
forming a multi-layer structure on a surface of the donor wafer at a thickness sufficient to provide multiple layers, each layer adapted for subsequent detachment from the donor wafer;
forming a buffer structure on the donor wafer, wherein the buffer structure includes a support substrate and a buffer layer between the support substrate and the multi-layer structure;
detaching one layer of the multi-layer structure at a zone of weakness for transfer as a first layer while leaving behind a remaining portion of the multi-layer structure on a surface of the donor wafer that includes at least one additional layer; and
removing material from the zone of weakness of the remaining portion of the multi-layer structure to provide a planarized surface for subsequent detachment of one of the at least one additional layer of the multi-layer structure,
wherein the buffer layer is formed so as to have its lattice parameter progressing substantially in thickness between the lattice parameter of the support substrate and another lattice parameter substantially different from the lattice parameter of the support substrate.

12. The method of claim 11, wherein the multi-layer structure has sufficient thickness to provide at least three layers without a supplementary step of reforming the additional layer on the structure.

13. The method of claim 11, wherein the layers include pairs of sub-layers, with each sub-layer having sufficiently different properties from the other sub-layer in the layer such that one sub-layer may be selectively removed while at least one other sub-layer remains intact.

14. The method of claim 11, wherein a first layer of the multi-layer structure is formed of a material having a lattice parameter different from the lattice parameter of the adjacent layers, and is sufficiently thin such that the first layer may be elastically strained to have a lattice parameter similar to the lattice parameter of the adjacent layers, so that the first layer does not disturb the crystallographic structure of the adjacent layer or layers.

15. The method of claim 11, wherein at least one layer includes a doping element to facilitate selective removal, or the layers are made of materials having different porosities.

16. The method of claim 11, wherein the selective removal of material comprises deoxidation of an oxide layer.

17. The method of claim 11, wherein the material is removed by chemical etching.

18. The method of claim 17, wherein the material is removed by electrochemical or photo-electrochemical etching.

19. The method of claim 11, wherein the material is removed mechanically by a selective mechanical-chemical planarization.

20. The method of claim 11, wherein all layers are removed mechanically.

21. The method of claim 20, wherein the layers are removed by polishing, optionally including abrasion or chemical etching.

22. The method of claim 11, wherein the buffer layer comprises a semiconductor material of constant chemical composition having a lattice misfit with the support substrate, with the buffer layer having crystallographic defects in order to relax elastic stresses in the multi-layer structure.

23. The method of claim 11, wherein the buffer layer is formed of one or more of Si, SiGe, Ge or a nitride material.

24. The method of claim 11, wherein the multi-layer structure comprises one or more of: elastically strained Si, SiGe or Ge.

25. The method of claim 11, wherein the buffer layer has a lattice parameter progressing substantially in thickness between a lattice parameter of the support substrate and another lattice parameter substantially different from that of the support substrate.

26. The method of claim 11, wherein the buffer structure further comprises an additional layer having one or more of a sufficient thickness to confine defects or a surface lattice parameter that is different from that of the support substrate.

27. The method of claim 11, wherein the buffer structure is formed of a binary, ternary, quaternary, or higher degree atomic alloy belonging to atomic alloy Group IV-V, Group III-V, or Group II-VI.

28. The method of claim 11, wherein the donor wafer comprises one of the following:
   (A) a support substrate of Si and a buffer structure comprising a buffer layer of SiGe having a Ge concentration which increases in thickness and an additional layer of SiGe that is relaxed by the buffer layer;
   (B) a support substrate of Si and a buffer structure comprising a buffer layer of SiGe having with a Ge concentration which increases in thickness between about 0% and about 100% and an additional layer of SiGe that is relaxed by the buffer layer, having a Si concentration of about 0%;
   (C) a layer of Si;
   (D) a support substrate comprising GaAs in contact with the buffer structure, the buffer structure comprising a buffer layer having an atomic alloy of ternary or higher degree, belonging to Group III-V, and having a composition which chosen from among the possible combinations of (Al, Ga, In), (N, P, As), and at least two elements chosen from Group III or these two latter elements having a concentration evolving gradually in the thickness of the buffer layer;
   (E) the buffer structure of (D) which further comprises, near its interface with the support substrate, a lattice parameter that is close to that of InP;
   (F) a support substrate of sapphire, SiC, or Si, with a buffer structure comprising a buffer layer of $Al_xGa_{1-x}N$, with x varying from 0 to 1 starting from the interface with the support substrate, optionally including an additional layer of GaN; or
   (G) a support substrate of sapphire, SiC, or Si, a mask and a buffer layer of GaN, optionally with another layer of GaN between the mask and support substrate.

29. The method of claim 28, wherein the layers to be detached comprise Si or elastically stressed Si; Ge or elastically stressed Ge, SiGe and Ge; GaAs and Ge; an alloy belonging to Group III-V; GaAs, InP; InGaAs; AlN, InN, or GaN.

30. The method of claim 11, which further comprises detaching at least a second layer from the remaining portion of the multi-layer structure.

* * * * *

UNITED STATES PATENT AND TRADEMARK OFFICE
CERTIFICATE OF CORRECTION

PATENT NO. : 7,256,075 B2  Page 1 of 1
APPLICATION NO. : 11/075273
DATED : August 14, 2007
INVENTOR(S) : Ghyselen et al.

It is certified that error appears in the above-identified patent and that said Letters Patent is hereby corrected as shown below:

Title Page:
Item (75) Inventors, correct the name of inventor "Yves Mathieu Le Vaillant" to -- Yves Matthieu Le Vaillant -- .

Item (56) References Cited, U.S. PATENT DOCUMENTS:
Sakaguchi et al. patent no. 6,426,270 B2, change "7/2003" to -- 7/2002 --.

On Title Page (56):
OTHER PUBLICATIONS
B. Holländer et al. reference, after "*heterostructures after hydrogen*", change "*of*" to -- *or* --, and after "357-367" delete "(2001)".
S.J. Pearton et al. reference, after "vol. 64, No.", change "7" to -- 17 --.
S. Nakamura reference, before "lifetime of longer than 10,000 hours", change "*Estimate*" to -- *Estimated* --; and before "Bulletin", change "Mrs" to --MRS--.
Q.Y. Tong et al. reference, before "Wiley & Sons, Inc.", change "Johnson" to -- John --.

In the Specification:

Column 34:
Line 67 (claim 27, line 4), change "III-V." to -- III-V, --.

Column 35:
Line 20 (claim 28, line 20), after "Group III or", insert -- V, --.

Signed and Sealed this

Twentieth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,256,075 B2  
APPLICATION NO. : 11/075273  
DATED : August 14, 2007  
INVENTOR(S) : Ghyselen et al.

It is certified that error appears in the above-identified patent and that said Letters Patent is hereby corrected as shown below:

Title Page:  
Item (75) Inventors, correct the name of inventor "Yves Mathieu Le Vaillant" to -- Yves Matthieu Le Vaillant -- .

Item (56) References Cited, U.S. PATENT DOCUMENTS:  
Sakaguchi et al. patent no. 6,426,270 B2, change "7/2003" to -- 7/2002 --.

On Title Page (56):  
OTHER PUBLICATIONS  
B. Holländer et al. reference, after "*heterostructures after hydrogen*", change "*of*" to -- *or* --, and after "357-367" delete "(2001)".  
S.J. Pearton et al. reference, after "vol. 64, No.", change "7" to -- 17 --.  
S. Nakamura reference, before "lifetime of longer than 10,000 hours", change "*Estimate*" to -- *Estimated* --; and before "Bulletin", change "Mrs" to --MRS--.  
Q.Y. Tong et al. reference, before "Wiley & Sons, Inc.", change "Johnson" to -- John --.

Column 34:  
Line 67 (claim 27, line 4), change "III-V." to -- III-V, --.

Column 35:  
Line 20 (claim 28, line 20), after "Group III or", insert -- V, --.

This certificate supersedes the Certificate of Correction issued November 20, 2007.

Signed and Sealed this

Eighth Day of April, 2008

JON W. DUDAS  
*Director of the United States Patent and Trademark Office*